United States Patent
Zhong et al.

(10) Patent No.: US 12,327,510 B2
(45) Date of Patent: Jun. 10, 2025

(54) DISPLAY PANEL AND METHOD FOR DRIVING THE SAME, AND DISPLAY APPARATUS

(71) Applicants: Xiamen Tianma Optoelectronics Co., Ltd., Xiamen (CN); Xiamen Tianma Micro-Electronics Co., Ltd., Xiamen (CN)

(72) Inventors: Yuhao Zhong, Xiamen (CN); Min Huang, Xiamen (CN); Jiancai Huang, Xiamen (CN); Ming Fang, Xiamen (CN)

(73) Assignees: Xiamen Tianma Optoelectronics Co., Ltd., Xiamen (CN); Xiamen Tianma Micro-Electronics Co., Ltd., Xiamen (CN)

( * ) Notice: Subject to any disclaimer, the term of this patent is extended or adjusted under 35 U.S.C. 154(b) by 62 days.

(21) Appl. No.: 18/390,236

(22) Filed: Dec. 20, 2023

(65) Prior Publication Data
US 2024/0135857 A1  Apr. 25, 2024

(30) Foreign Application Priority Data
Oct. 10, 2023 (CN) .......................... 202311308937.0

(51) Int. Cl.
*G09G 3/20* (2006.01)
*G11C 19/28* (2006.01)

(52) U.S. Cl.
CPC ... *G09G 3/2092* (2013.01); *G09G 2310/0267* (2013.01); *G09G 2310/0286* (2013.01);
(Continued)

(58) Field of Classification Search
CPC ......... G09G 3/2092; G09G 2310/0267; G09G 2310/0286; G09G 2310/08; G09G 2330/021; G09G 3/20; G09G 3/3233; G09G 3/3266; G09G 2320/0686; G09G 2340/04; G11C 19/28
See application file for complete search history.

(56) References Cited

U.S. PATENT DOCUMENTS 11,915,634 B2 *  2/2024  Du ..................... H10K 59/1213
12,073,761 B2 *  8/2024  Zhou ................... G09G 3/3677
(Continued)

FOREIGN PATENT DOCUMENTS

CN  115731839 A  3/2023

*Primary Examiner* — Jeff Piziali
(74) *Attorney, Agent, or Firm* — Christensen O'Connor Johnson Kindness PLLC

(57) ABSTRACT

A display panel, a driving method thereof, and a display apparatus. The display panel includes a shift register circuit including shift units. The shift unit includes a first output circuit, a control circuit, and a first node. In a first mode, a display region includes a first sub-region refreshed with a first frequency and a second sub-region refreshed with a second frequency. The shift register circuit includes a first unit group and a second unit group. In some frames, the first and second unit groups output an active scanning level, and in some frames, the control circuit in a first shift unit supplies a non-enabling level to the first node at least after the first unit group outputs the active scanning level. The first shift unit is located in the second unit group and is adjacent to the first unit group.

20 Claims, 22 Drawing Sheets

(52) U.S. Cl.
CPC ... *G09G 2310/08* (2013.01); *G09G 2330/021* (2013.01); *G11C 19/28* (2013.01)

(56) References Cited

U.S. PATENT DOCUMENTS

| 2010/0079422 | A1* | 4/2010 | Shimodaira | G09G 3/344 |
| | | | | 345/205 |
| 2019/0005905 | A1* | 1/2019 | Chen | G09G 3/3618 |
| 2022/0122546 | A1* | 4/2022 | Long | G09G 3/3266 |

* cited by examiner

DISPLAY PANEL AND METHOD FOR DRIVING THE SAME, AND DISPLAY APPARATUS

CROSS-REFERENCE TO RELATED DISCLOSURE

The present disclosure claims priority to Chinese Patent Application No. 202311308937.0, filed on Oct. 10, 2023, the content of which is incorporated herein by reference in its entirety.

TECHNICAL FIELD

The present disclosure relates to the technical field of display, and in particular to a display panel and a method for driving the same, and a display apparatus.

BACKGROUND

In some application scenarios, a display panel needs to display different contents or images in different regions of the display panel. For example, when a user watches a short video, usually only the upper part of the screen accounting for one third to one half of the screen is used to display the video, and the lower part of the screen is used to display comments on the short video. Displaying videos and displaying comments have different requirements on refresh rates. Therefore, if the entire display panel maintains a relatively high refresh rate, power consumption increases.

SUMMARY

Embodiments of the present disclosure provide a display panel and a display apparatus.

According to one aspect of the embodiments of the present disclosure, a display panel is provided. The display panel includes a display region, a non-display region, pixel circuits located in the display region, and a shift register circuit. The shift register circuit is located in the non-display region and includes a plurality of cascaded shift units. One or more of the shift units each include a first node, a first output circuit and a control circuit. The first output circuit is configured to output an active scanning level or an inactive scanning level in response to an enabling level at the first node. The control circuit is configured to provide a non-enabling level to the first node.

The display panel has a first mode. In the first mode, the display region includes a first sub-region and a second sub-region that are adjacent in a first direction, data refreshing of the first sub-region is performed at a first frequency, data refreshing of the second sub-region is performed at a second frequency, and the first frequency is greater than the second frequency. The shift register circuit includes a first unit group and a second unit group. The first unit group is electrically connected to the pixel circuits in the first sub-region. The second unit group is electrically connected to the pixel circuits in the second sub-region. The shift unit in the second unit group that is cascaded subsequent to the last shift unit in the first unit group is a first shift unit.

In the first mode, in some frames, the first unit group and the second unit group sequentially output the active scanning level, and in some frames, the control circuit in the first shift unit provides the non-enabling level to the first node at least after the first unit group outputs the active scanning level.

Duration of one frame is t, $$t = \frac{1}{f},$$

f is a reference frequency, greater than or equal to the first frequency, and the reference frequency is an integer multiple of each of the first frequency and the second frequency.

According to another aspect of the embodiment of the present disclosure, a method for driving a display panel is provided.

The display panel includes a display region, a non-display region, pixel circuits located in the display region, and a shift register circuit. The shift register circuit is located in the non-display region and includes a plurality of cascaded shift units. One or more of the shift units each include a first node, a first output circuit and a control circuit. The first output circuit is configured to output an active scanning level or an inactive scanning level in response to an enabling level at the first node. The control circuit is configured to provide a non-enabling level to the first node.

The display panel has a first mode. In the first mode, the display region includes a first sub-region and a second sub-region that are adjacent in a first direction, data refreshing of the first sub-region is performed at a first frequency, data refreshing of the second sub-region is performed at a second frequency, and the first frequency is greater than the second frequency. The shift register circuit includes a first unit group and a second unit group. The first unit group is electrically connected to the pixel circuits in the first sub-region. The second unit group is electrically connected to the pixel circuits in the second sub-region. The shift unit in the second unit group that is cascaded subsequent to the last shift unit in the first unit group is a first shift unit.

The driving method includes: in the first mode, in some frames, controlling the first unit group and the second unit group to sequentially output the active scanning level, and in some frames, controlling the control circuit in the first shift unit to provide the non-enabling level to the first node at least after the first unit group outputs the active scanning level.

Duration of one frame is t, $$t = \frac{1}{f},$$

f is a reference frequency greater than or equal to the first frequency, and the reference frequency is an integer multiple of each of the first frequency and the second frequency.

According to still another aspect of the embodiments of the present disclosure, a display apparatus is provided. The display apparatus includes a display panel. The display panel includes: a display region, a non-display region, pixel circuits located in the display region, and a shift register circuit. The shift register circuit is located in the non-display region and includes a plurality of cascaded shift units. One or more of the shift units each include a first node, a first output circuit and a control circuit. The first output circuit is configured to output an active scanning level or an inactive scanning level in response to an enabling level at the first node. The control circuit is configured to provide a non-enabling level to the first node.

The display panel has a first mode. In the first mode, the display region includes a first sub-region and a second sub-region that are adjacent in a first direction, data refreshing of the first sub-region is performed at a first frequency, data refreshing of the second sub-region is performed at a second frequency, and the first frequency is greater than the second frequency. The shift register circuit includes a first unit group and a second unit group. The first unit group is electrically connected to the pixel circuits in the first sub-region. The second unit group is electrically connected to the pixel circuits in the second sub-region. The shift unit in the second unit group that is cascaded subsequent to the last shift unit in the first unit group is a first shift unit.

In the first mode, in some frames, the first unit group and the second unit group sequentially output the active scanning level, and in some frames, the control circuit in the first shift unit provides the non-enabling level to the first node at least after the first unit group outputs the active scanning level.

Duration of one frame is t, $$t = \frac{1}{f},$$

f is a reference frequency, greater than or equal to the first frequency, and the reference frequency is an integer multiple of each of the first frequency and the second frequency.

BRIEF DESCRIPTION OF THE DRAWINGS

To describe the technical solutions in the embodiments of the present disclosure more clearly, the following briefly describes the accompanying drawings required to be used in the embodiments. Apparently, the accompanying drawings in the following description show merely some embodiments of the present disclosure, and a person of ordinary skill in the art may still derive other accompanying drawings from these accompanying drawings without creative efforts.

DESCRIPTION OF EMBODIMENTS

For the sake of a better understanding of the technical solutions of the present disclosure, the embodiments of the present disclosure are described in detail below with reference to the accompanying drawings.

It should be noted that the embodiments in the following descriptions are merely some rather than all of the embodiments of the present disclosure. All other embodiments obtained by a person of ordinary skill in the art on the basis of the embodiments of the present disclosure shall fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

It should be understood that although the terms "first", "second", and so on may be used to describe sub-regions in the embodiments of the present disclosure, the sub-regions should not be limited to these terms. These terms are merely used to distinguish the sub-regions from one another. For example, without departing from the scope of the embodiments of the present disclosure, a first sub-region may also be referred to as a second sub-region. Similarly, a second sub-region may also be referred to as a first sub-region.

It should be understood that the term "and/or" in this specification merely describes associations between associated objects, and it indicates three types of relationships. For example, A and/or B may indicate that A exists alone, A and B coexist, or B exists alone. In addition, the character "I" in this specification generally indicates that the associated objects are in an "or" relationship.

Figure 1:
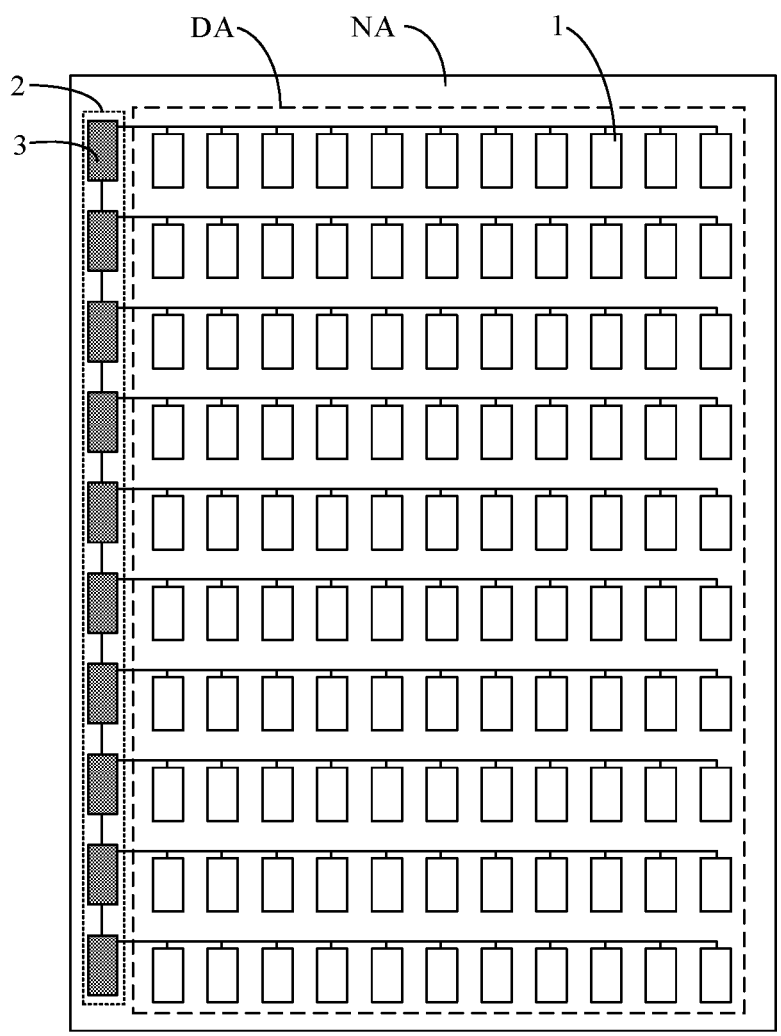
FIG. 1 is a schematic structural diagram of a display panel according to an embodiment of the present disclosure.
Figure 2:
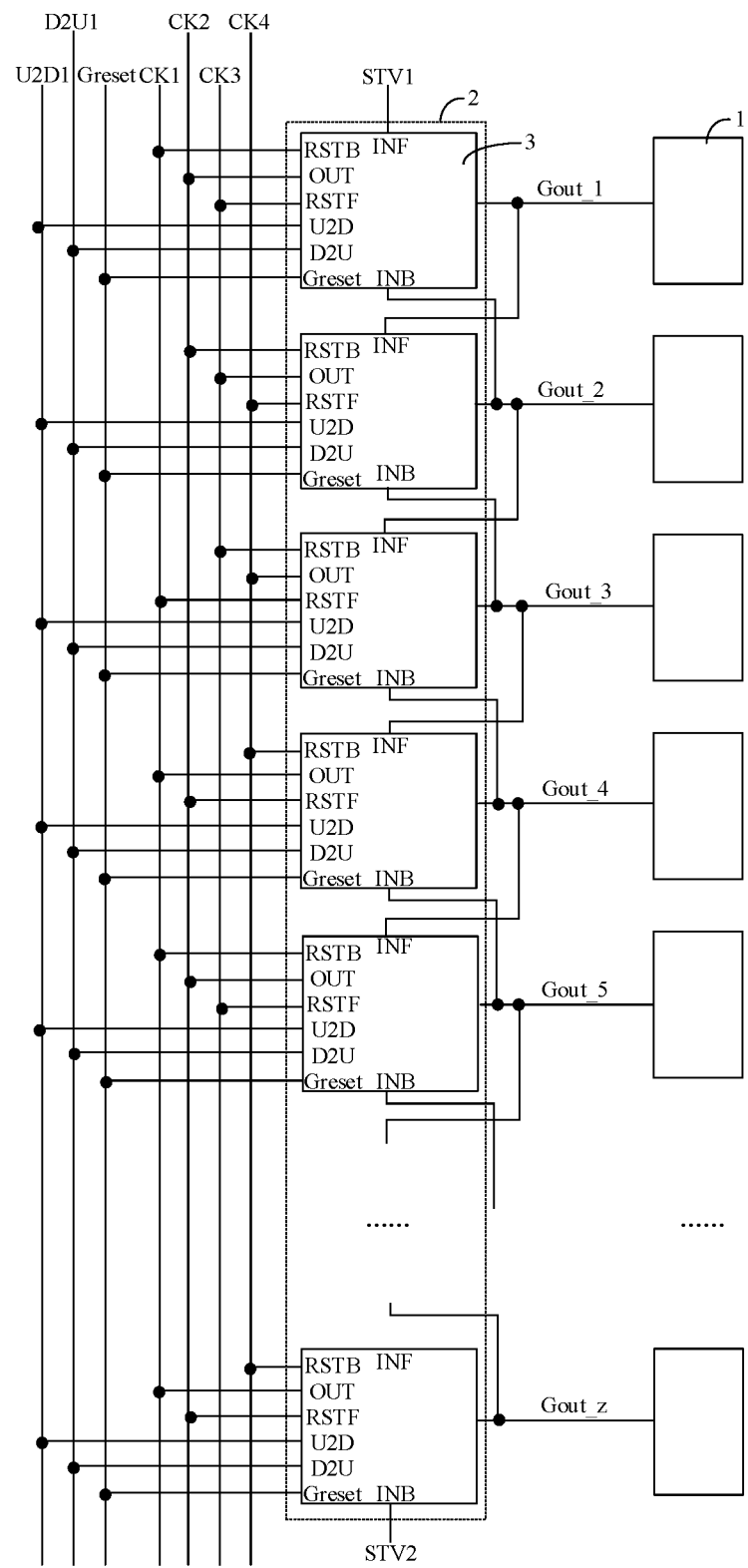
FIG. 2 is a schematic structural diagram of a shift register circuit according to an embodiment of the present disclosure.
Figure 3:
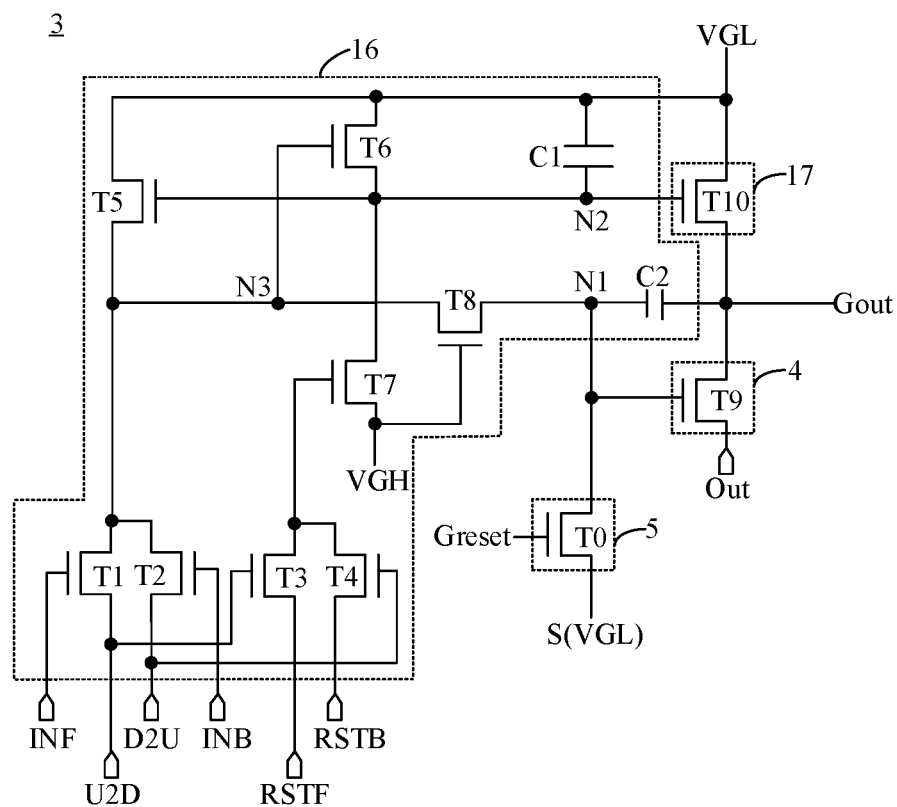
FIG. 3 is a schematic diagram of a circuit structure of a shift unit according to an embodiment of the present disclosure.

An embodiment of the present disclosure provides a display panel FIG. 1 is a schematic structural diagram of a display panel according to an embodiment of the present disclosure. FIG. 2 is a schematic structural diagram of a shift register circuit 2 according to an embodiment of the present disclosure. FIG. 3 is a schematic diagram of a circuit structure of a shift unit 3 according to an embodiment of the present disclosure. As shown in FIG. 1 to FIG. 3, the display panel includes a display region DA and a non-display region NA. The display region DA is a screen display region. The non-display region NA is a border region surrounding the display region DA. The display panel further includes pixel circuits 1 and a shift register circuit 2. The pixel circuits 1 are located in the display region DA. The shift register circuit 2 is located in the non-display region NA. The shift register circuit 2 includes a plurality of cascaded shift units 3. One or more of the shift units 3 each include a first node N1, a first output circuit 4 and a control circuit 5. For example, each shift unit 3 includes a first node N1, a first output circuit 4 and a control circuit 5. The first output circuit 4 is configured to output an active scanning level or an inactive scanning level in response to an enabling level at the first node N1 of the shift unit 3. The control circuit 5 is configured to provide a non-enabling level to the first node N1.

It should be noted that the active scanning level is a level that turns on a data write transistor in the pixel circuit 1. When the data write transistor is turned on, if a data voltage is transmitted on a data line, the data voltage may be written in a driver transistor to cause the pixel circuit 1 to refresh data. As an example, transistors in both the pixel circuit 1 and the shift unit 3 are all N-type transistors. In this case, both the enabling level and the active scanning level are high levels, and both the non-enabling level and the inactive scanning level are low levels. The first output circuit 4 is configured to output a high level or a low level in response to the high level at the first node N1. The control circuit 5 is configured to provide a low level to the first node N1. When the control circuit 5 provides the low level to the first node N1, the first output circuit 4 cannot output the high level.

Figure 4:
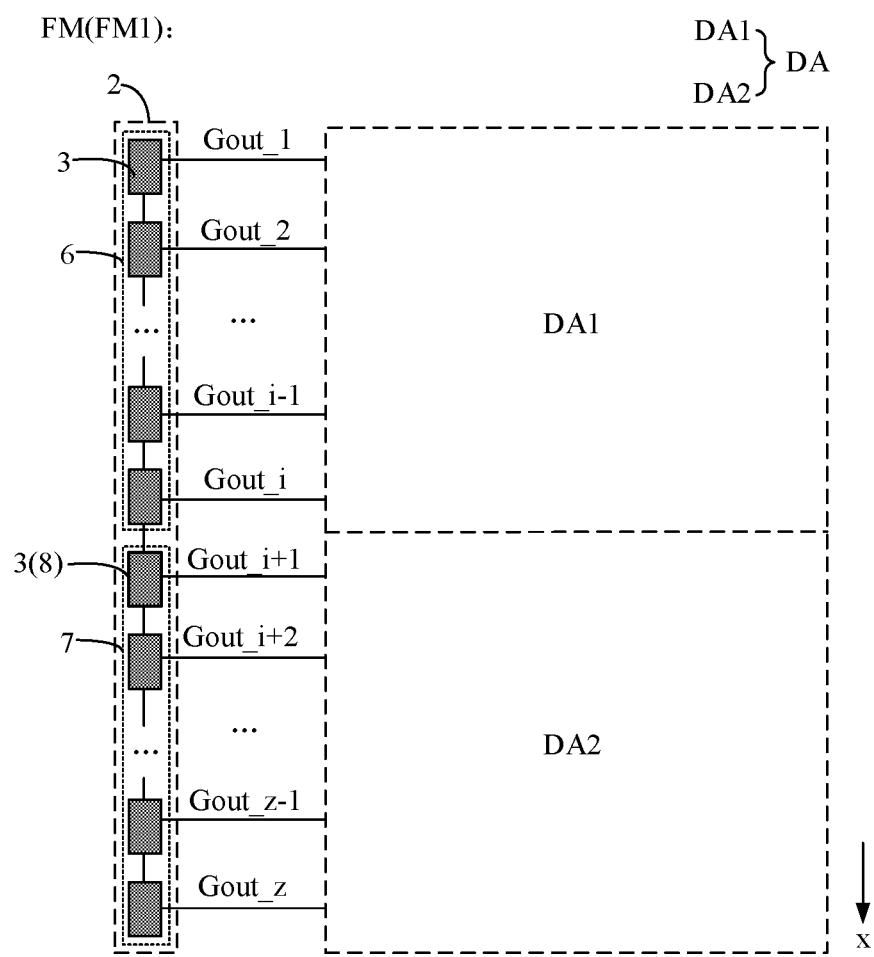
FIG. 4 is a schematic diagram illustrating display regions of a display panel in a first mode according to an embodiment of the present disclosure.

FIG. 4 is a schematic diagram illustrating display regions of a display panel in a first mode FM according to an embodiment of the present disclosure. The display panel has the first mode FM. As shown in FIG. 4, in the first mode FM, the display region DA includes a first display sub-region DA1 and a second display sub-region DA2 that are adjacent in a first direction x. The first display sub-region DA1 and the second display sub-region DA2 are sub-regions of the display region DA. Data refreshing is performed at a first frequency in the first display sub-region DA1. Data refreshing is performed at a second frequency in the second display sub-region DA2. The first frequency is greater than the second frequency. The shift register circuit 2 includes a first unit group 6 and a second unit group 7. The shift units 3 in the first unit group 6 are electrically connected to the pixel circuits 1 in the first display sub-region DA1 (not shown in FIG. 4). The shift units 3 in the second unit group 7 are electrically connected to the pixel circuits 1 in the second display sub-region DA2 (not shown in FIG. 4). The shift unit 3, adjacent to the first unit group 6, in the second unit group 7 is a first shift unit 8. For example, the shift unit 3 in the second unit group 7 that is cascaded subsequent to the last shift unit in the first unit group 6 is the first shift unit 8. For example, the shift units 3 in the shift register circuit 2 are cascaded and includes a first-stage shift unit to a $p^{th}$-stage shift unit, the first unit group 6 includes the first-stage shift unit to the $q^{th}$-stage shift unit, the second unit group 7 includes the $(q+1)^{th}$-stage shift unit to the $p^{th}$-stage shift unit, and the $(q+1)^{th}$-stage shift unit is the first shift unit 8, where p and q are integers, p is greater than q, and q is greater than 1.

That is, in the first mode FM, the display region DA of the display panel is vertically divided into at least the first display sub-region DA1 and the second display sub-region DA2. The first display sub-region DA1 is driven at a higher frequency, whereas the second display sub-region DA2 is driven at a lower frequency. Correspondingly, the shift register circuit 2 is divided into at least the first unit group 6 and the second unit group 7. The first unit group 6 is configured to output the active scanning level to the pixel circuits 1 in the first display sub-region DA1. The second unit group 7 is configured to output the active scanning level to the pixel circuits 1 in the second display sub-region DA2.

The display panel displays frame by frame. In the first mode FM, in some frames, the first unit group 6 and the second unit group 7 sequentially output the active scanning level, and in another some frames, the control circuit 5 in the first shift unit 8 provides the non-enabling level to the first node N1 at least after the first unit group 6 outputs the active scanning level.

Duration of one frame is t, and $$t = \frac{1}{f},$$

where f is a reference frequency. The reference frequency is greater than or equal to the first frequency, and the reference frequency is an integral multiple of each of the first frequency and the second frequency. For example, the first frequency is 120 Hz, and the second frequency is 60 Hz. In this case, the reference frequency may be set to 120 Hz. Alternatively, the first frequency is 120 Hz, and the second frequency is 80 Hz. In this case, the reference frequency may be set to 240 Hz.

It should be noted that the arrangement the control circuit 5 in the first shift unit 8 provides the non-enabling level to the first node N1 at least after the first unit group 6 outputs the active scanning level at least includes the following two cases. In a first case, after the first unit group 6 outputs the active scanning level, the control circuit 5 in the first shift unit 8 supplies the non-enabling level to the first node N1. In a second case, before the first unit group 6 outputs the active scanning level, the control circuit 5 in the first shift unit 8 has started to supply the non-enabling level to the first node N1, and the process of supplying the non-enabling level by the control circuit 5 to the first node N1 continues until after the first unit group 6 outputs the active scanning level.

Based on the display panel provided in the embodiments of the present disclosure, the display panel needs to perform partition display in the first mode FM. In the first mode FM, in some frames, the shift units 3 in the first unit group 6 and the second unit group 7 sequentially output the active scanning level, such that both display data in the first sub-region DA1 and display data in the second sub-region DA2 are refreshed. In another some frames, after the shift units 3 in the first unit group 6 output the active scanning level, because the control circuit 5 in the first shift unit 8 provides the non-enabling level to the first node N1, the first output circuit 4 of the first shift unit 8 cannot continue to output the active scanning level. In other words, a shift path from the first unit group 6 to the second unit group 7 is cut off. In this way, these frames are used as blank frames of the second display sub-region DA2 to prolong a data refreshing cycle of the second display sub-region DA2, thereby reducing a data refresh rate of the second display sub-region DA2 and enabling low-frequency driving in the second display sub-region DA2.

The following descriptions of the embodiments of the present disclosure are all provided using an example in which both the enabling level and the active scanning level are high levels. For example, the reference frequency and the first frequency are 120 Hz, and the second frequency is 60 Hz. In this case, one frame is 8.33 ms. In an odd-numbered frame, the first unit group 6 and the second unit group 7 sequentially output a high level to refresh data in the first display sub-region DA1 and data in the second display sub-region DA2 respectively. In an even-numbered frame, the first unit group 6 outputs a high level, the second unit group 7 does not output a high level, such that data in the first display sub-region DA1 is refreshed, whereas data in the second display sub-region DA2 is not refreshed. In this way, data refreshing is performed every 8.33 ms in the first display sub-region DA1, and data refreshing is performed only every 16.88 ms in the second display sub-region DA2.

To sum up, in the embodiments of the present disclosure, through the arrangement of the control circuits 5 in the shift units 3, in some frames in the first mode FM, the control circuit 5 in the first shift unit 8 cuts off the shift path from the first unit group 6 to the second unit group 7, such that the second unit group 7 does not output the active scanning level in these frames. Therefore, data in the second display sub-region DA2 is not refreshed in these frames, thereby reducing the refresh rate of the second display sub-region DA2. In this way, when different screens need to be displayed in different display regions, data refresh rates of the different display regions may be adjusted according to contents to be displayed in the different display regions, thereby avoiding a waste of power consumption resulting from high-frequency driving of the entire screen.

In addition, when the display panel provided in this embodiment of the present disclosure displays different contents in different display sub-regions at different frequencies, there is no need to change the original overall architecture and driving sequence of the shift register circuit 2. Instead, it just needs to arrange, in the shift unit 3, a control circuit 5 capable of providing a non-enabling level to the first node N1, and add a signal and its timing for driving the control circuit 5. The control method is simple and easy to implement. In addition, this embodiment of the present disclosure may further flexibly adjust the frequencies of the first sub-region DA1 and the second sub-region DA2 and a position of a line dividing the display region DA into the two sub-regions. For example, with reference to FIG. 2 to FIG. 5, when the control circuits 5 in multiple shift units 3 are electrically connected to a control signal line Greset, regardless of how the position of the dividing line changes, that is, regardless of how a position of the first shift unit 8 changes, it only needs to adjust a time during which the control signal line Greset provides an enable signal, to cause the first shift unit 8 to cut off the shift path between the first unit group 6 and the second unit group 7 in some frames.

Further, the inventor also verified the technical solutions of the embodiments of the present disclosure. When the first sub-region DA1 and the second sub-region DA2 each occupy one half of the screen, the first frequency is 120 Hz, and the second frequency is 30 Hz. Conventionally, the entire screen data needs to be refreshed at 120 Hz, but in the embodiments of the present disclosure, the first sub-region DA1 may be refreshed at 120 Hz and the second sub-region DA2 may be refreshed 30 Hz. During display of a white screen, conventionally, digital power consumption (power consumption generated by an IC for image processing) is 85 mW, analog power consumption (power consumption generated due to the signal output of the IC) is 105 mW, and total power consumption is 190 mW. However, in the present disclosure, digital power consumption is 62.6 mW, analog power consumption is 77.4 mW, and total power consumption is 140 mW. The power consumption is reduced by 26.3%. During display of a color bar screen, conventionally, digital power consumption is 100.2 mW, analog power consumption is 133.5 mW, and total power consumption is 233.7 mW. However, in the present disclosure, digital power consumption is 72.1 mW, analog power consumption is 95 mW, and total power consumption is 167.1 mW. The power consumption is reduced by 28.5%. During display of a color picture screen, conventionally, digital power consumption is 144.7 mW, analog power consumption is 119.4 mW, and total power consumption is 264 mW. However, in the present disclosure, digital power consumption is 99.8 mW, analog power consumption is 86.3 mW, and total power consumption is 186.1 mW. The power consumption is reduced by 29.5%. It can be concluded that, with the technical solutions provided in this embodiment of the present disclosure, the power consumption generated by the display panel can be significantly reduced.

Figure 5:
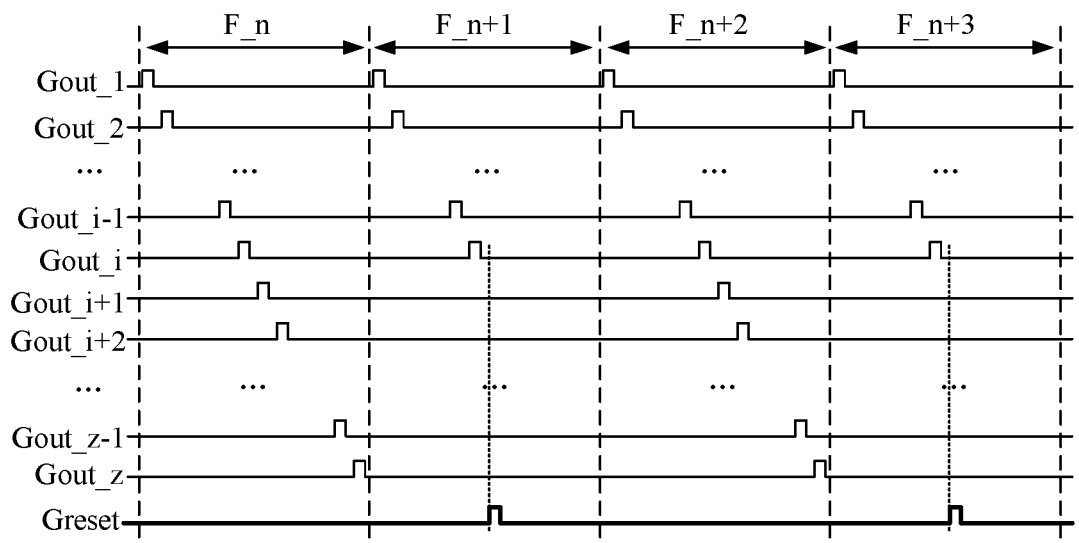
FIG. 5 is a schematic timing diagram corresponding to FIG. 4.

In some embodiments, with reference to FIG. 4 and FIG. 5, the first mode FM includes at least one first sub-mode FM1. In the first sub-mode FM1, $f1=x1 \times f2$, f1 is the first frequency, f2 is the second frequency, x1 is an integer and $x1 \geq 2$, and the reference frequency is equal to the first frequency. That is, in the first sub-mode FM1, the first frequency is an integer multiple of the second frequency, and the reference frequency is the same as the first frequency. For example, the reference frequency and the first frequency are 120 Hz, and the second frequency is 60 Hz, 30 Hz, 15 Hz, or the like. Correspondingly, x1 is 2, 4, 8, or the like.

In the first sub-mode FM1, a scanning direction of the display region DA is from the first sub-region DA1 to the second sub-region DA2. For every x1 adjacent frames, in one frame of the x1 frames, the first unit group 6 and the second unit group 7 sequentially output the active scanning level. That is, the shift units 3 in the first unit group 6 and the shift units 3 in the second unit group 7 sequentially output the active scanning level. In the remaining x1-1 frames, the control circuit 5 in the first shift unit 8 supplies the non-enabling level to the first node N1 of the first shift unit 8 at least after the first unit group 6 outputs the active scanning level.

As an example, the reference frequency and the first frequency are each 120 Hz, and the second frequency is 60 Hz (x1=2). FIG. 5 is a schematic timing diagram corresponding to FIG. 4. With reference to FIG. 4 and FIG. 5, for every two adjacent frames, in one of the two adjacent frames, the shift units 3 (corresponding to Gout_1 to Gout_z) in the first unit group 6 and the second unit group 7 sequentially output the high level. In the other frame of the two adjacent frames, the shift units 3 (corresponding to Gout_1 to Gout_i) in the first unit group 6 sequentially output the high level. The first shift unit 8 (corresponding to Gout_i+1) cuts off the shift path from the first unit group 6 to the second unit group 7, such that the shift units 3 (corresponding to Gout_i+1 to Gout_z) in the second unit group 7 do not output the high level.

It should be noted that, in the accompanying drawings of the embodiments of the present disclosure, an $n^{th}$ frame F_n can be either an odd-numbered frame or an even-numbered frame. This is not limited in the present disclosure.

In the first sub-mode FM1, when the first frequency and the second frequency have an integer-multiple relationship, compared with setting the reference frequency to twice, three times, or the like of the first frequency, directly setting the reference frequency to be the same as the first frequency can prevent the reference frequency from being too high, thereby avoiding increasing the design difficulty of the frequencies of the display panel.

Figure 6:
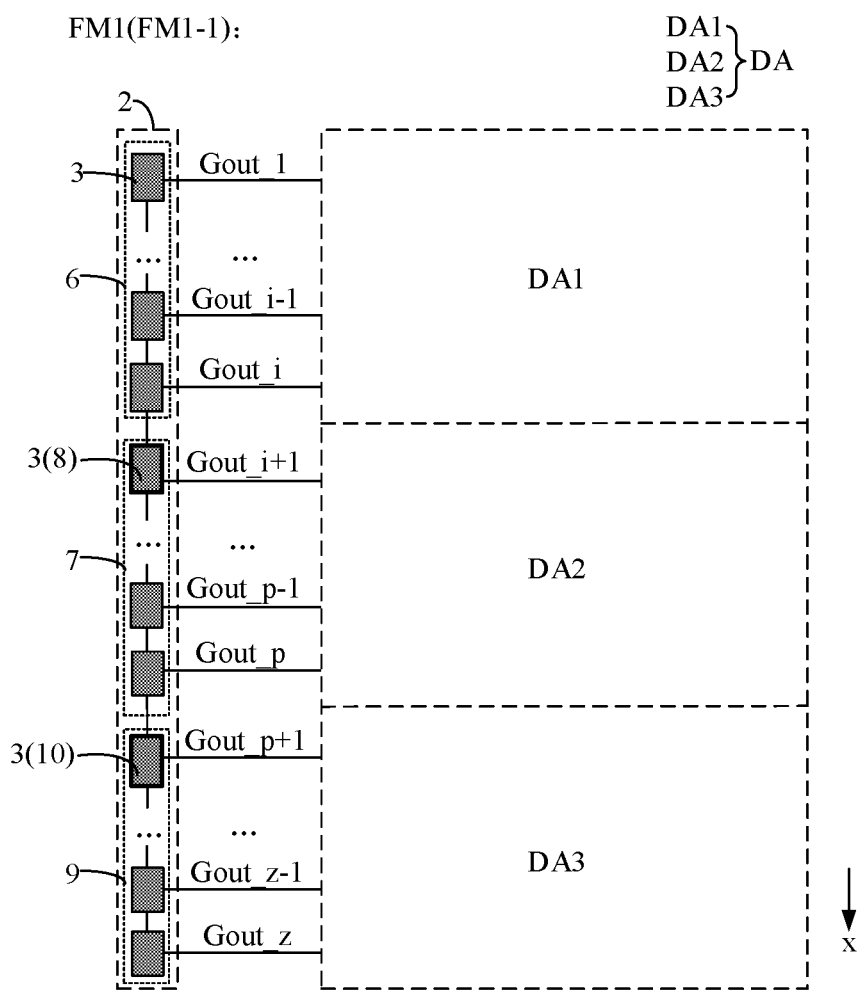
FIG. 6 is a schematic diagram illustrating display regions of a display panel in a first-type first sub-mode according to an embodiment of the present disclosure.
Figure 7:
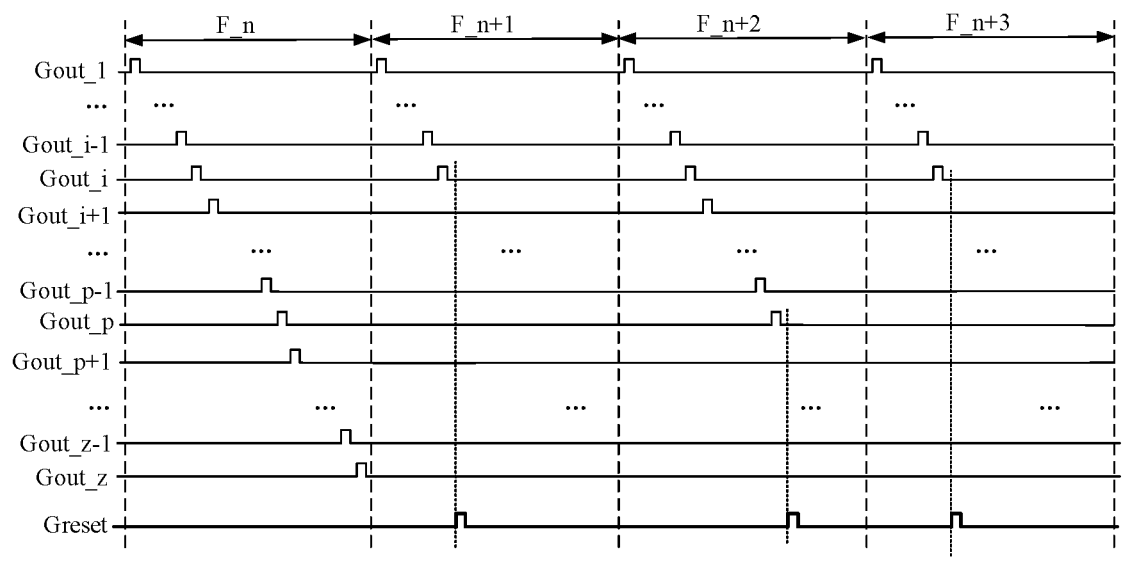
FIG. 7 is a schematic timing diagram corresponding to FIG. 6.

In some embodiments, with reference to FIG. 6 and FIG. 7, at least one first sub-mode FM1 includes a first-type first sub-mode FM1-1. In the first-type first sub-mode FM1-1, the display region DA further includes a third sub-region DA3 that is adjacent to the second sub-region DA2 in the first direction x. The first sub-region DA1 and the third sub-region DA3 are located at two opposite sides of the second sub-region DA2. The scanning direction of the display region DA is from the first sub-region DA1 to the third sub-region DA3. Data refreshing is performed at a third frequency in the third sub-region DA3. f1=k1×x1×f3, f3 is the third frequency, and k1 is an integer and k1≥2. That is, the third frequency is less than the second frequency, and the second frequency is an integer multiple of the third frequency. The shift register circuit 2 further includes a third unit group 9. The third unit group 9 is electrically connected to the pixel circuits 1 in the third sub-region DA3 (not shown in FIG. 6). The shift unit 3 in the third unit group 9 and cascaded subsequent to the last shift unit in the second unit group 7 is a second shift unit 10.

In the first-type first sub-mode FM1-1, for every k1×x1 adjacent frames, in one of the k1×x1 frames, after the second unit group 7 outputs the active scanning level, the shift units 3 in the third unit group 9 sequentially outputs the active scanning level. In k1-1 frames of the k1×x1 frames, the control circuit 5 in the second shift unit 10 supplies the non-enabling level to the first node N1 at least after the second unit group 7 outputs the active scanning level.

It should be noted that, that the control circuit 5 in the second shift unit 10 supplies the non-enabling level to the first node N1 at least after the second unit group 7 outputs the active scanning level at least includes the following two cases. In a first case, after the second unit group 7 outputs the active scanning level, the control circuit 5 in the second shift unit 10 starts to supply the non-enabling level to the first node N1. In a second case, before the second unit group 7 outputs the active scanning level, the control circuit 5 in the second shift unit 10 has started to supply the non-enabling level to the first node N1, and the process supplying the non-enabling level by the control circuit 5 to the first node N1 continues until after the second unit group 7 outputs the active scanning level.

It can be understood that, because the first frequency is x1 times of the second frequency, in every k1×x1 adjacent frames, there are k1 frames in which after the first unit group 6 outputs the active scanning level, the shift units in the second unit group 7 sequentially output the active scanning level. In one of the k1 frames, after the second unit group 7 outputs the active scanning level, the shift units in the third unit group 9 continue to sequentially output the active scanning level. In the remaining k1-1 frames of the k1 frames, the control circuit 5 in the second shift unit 10 cuts off a shift path from the second unit group 7 to the third unit group 9, such that the third unit group 9 do not output the active scanning level.

As an example, the first frequency and the reference frequency are each 120 Hz, the second frequency is 60 Hz, and the third frequency is 30 Hz (x1=2 and k1=2). FIG. 6 is a schematic diagram showing display sub-regions a display panel in a first-type first sub-mode FM1-1 according to an embodiment of the present disclosure, and FIG. 7 is a schematic timing diagram corresponding to FIG. 6. As shown in FIG. 6 and FIG. 7, in the first-type first sub-mode FM1-1, there are four adjacent frames: an $n^{th}$ frame F_n, an $(n+1)^{th}$ frame F_n+1, an $(n+2)^{th}$ frame F_n+2, and an $(n+3)^{th}$ frame F_n+3. In the $n^{th}$ frame F_n and the $(n+2)^{th}$ frame F_n+2, the shift units 3 (corresponding to Gout_1 to Gout_p) in the first unit group 6 and the second unit group 7 sequentially output the high level. In the $n^{th}$ frame F_n, after the shift units 3 (corresponding to Gout_1 to Gout_p) in the first unit group 6 and the second unit group 7 sequentially output the high level, the shift units 3 (corresponding to Gout_p+1 to Gout_z) in the third unit group 9 sequentially output the high level. In the $(n+2)^{th}$ frame F_n+2, after the shift units 3 (corresponding to Gout_1 to Gout_p) in the first unit group 6 and the second unit group 7 sequentially output the high level, the second shift unit 10 (corresponding to Gout_p+1) cuts off the shift path from the second unit group 7 to the third unit group 9, such that the shift units 3 (corresponding to Gout_p+1 to Gout_z) in the third unit group 9 do not output the active scanning level. In the $(n+1)^{th}$ frame F_n+1 and the $(n+3)^{th}$ frame F_n+3, the shift units 3 (corresponding to Gout_1 to Gout_i) in the first unit group 6 sequentially output the high level, but the first shift unit 8 (corresponding to Gout_i+1) cuts off the shift path from the first unit group 6 to the second unit group 7, such that the shift units 3 (corresponding to Gout_i+1 to Gout_p) in the second unit group 7 do not output the high level. As a result, the shift units 3 (corresponding to Gout_p+1 to Gout_z) in the third unit group 9 also do not output the active scanning level.

In the four adjacent frames, data refreshing is performed four times in the first sub-region DA1, data refreshing is performed twice in the second sub-region DA2, and data refreshing is performed only once in the third sub-region DA3. In this way, the frequency of the first sub-region DA1 is twice of the frequency of the second sub-region DA2 and four times of the frequency of the third sub-region DA3.

The above arrangement can enable the display panel to perform display in at least three sub-regions at different frequencies in the first-type first sub-mode FM1-1. In this mode, the frequencies of the three sub-regions are gradually reduced sub-region by sub-region. Compared with the display in two sub-regions at different frequencies, this partition display manner is more flexible, suitable for more application scenarios. For example, a video screen may be displayed at a high frequency in one sub-region, a comment screen may be displayed at a low frequency in one sub-region, and a static screen such as a black border may be displayed at an ultra-low frequency in one sub-region. In addition, this display mode allows more precise control of frequencies at different positions of the display region DA to reduce power consumption to a greater extent.

Figure 8:
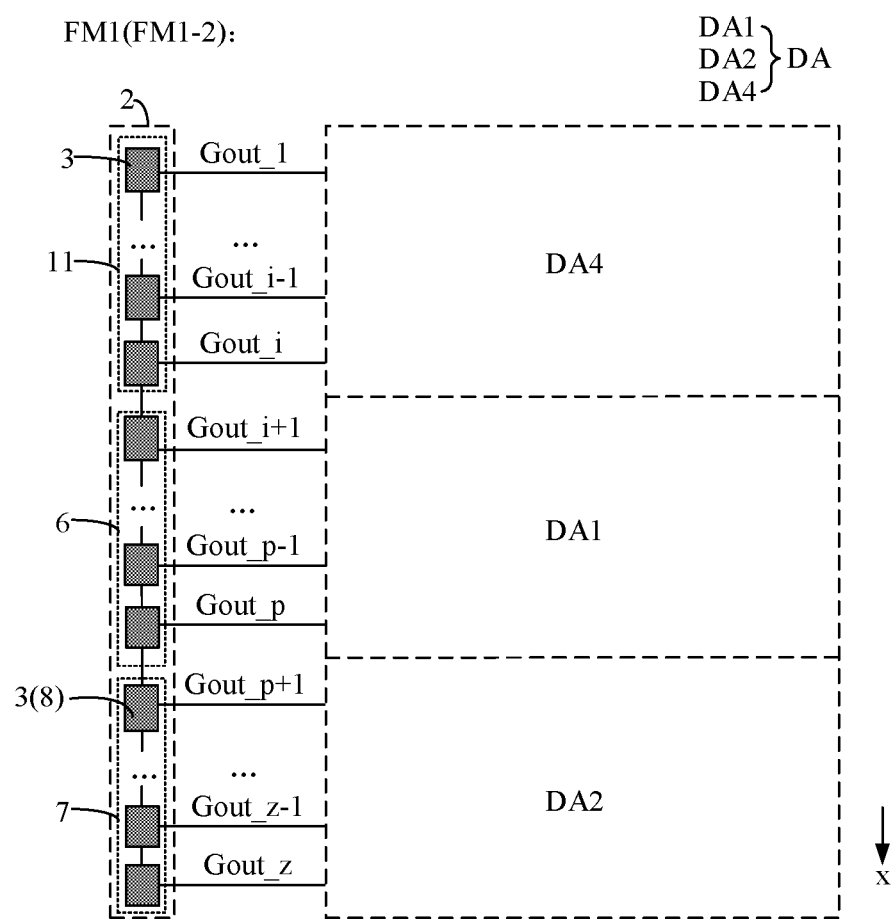
FIG. 8 is another schematic diagram illustrating display regions of a display panel in a first sub-mode according to an embodiment of the present disclosure.
Figure 9:
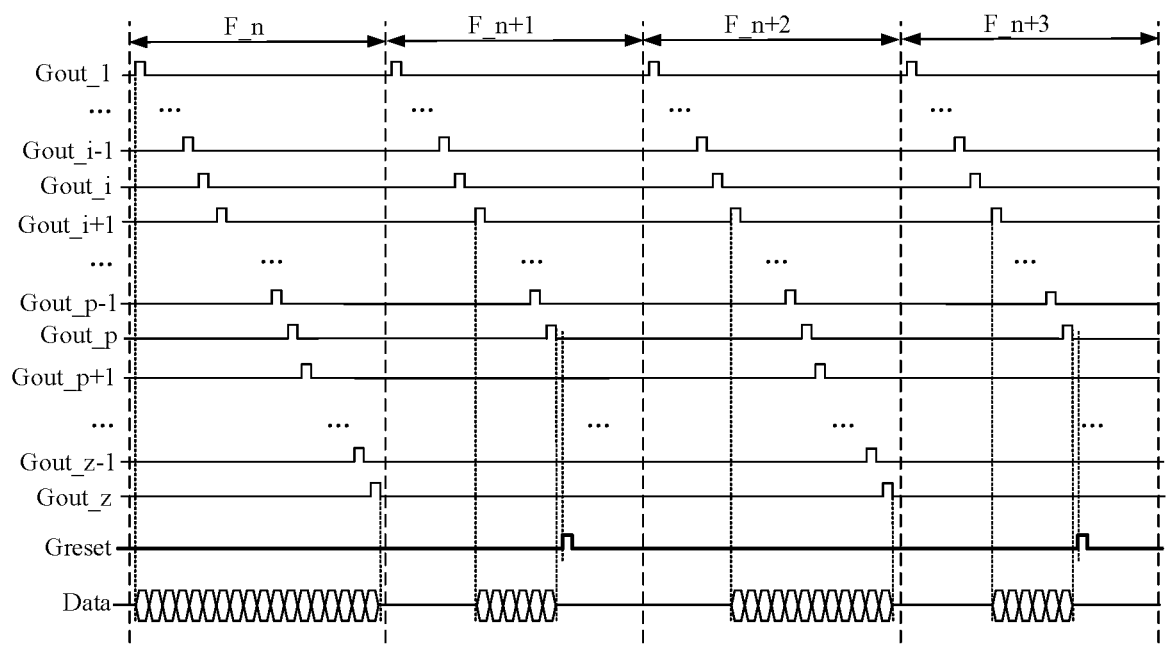
FIG. 9 is a schematic timing diagram corresponding to FIG. 8.

In some embodiments, with reference to FIG. 8 and FIG. 9, the at least one first sub-mode FM1 includes a second-type first sub-mode FM1-2. In the second-type first sub-mode FM1-2, the display region DA further includes a fourth sub-region DA4 that is adjacent to the first sub-region DA1 in the first direction x. The fourth sub-region DA4 and the second sub-region DA2 are located at two opposite sides of the first sub-region DA1. The scanning direction of the display region DA is from the fourth sub-region DA4 to the second sub-region DA2. Data refreshing is performed at a fourth frequency in the fourth sub-region DA4. f1=k2×x1× f4, f4 is the fourth frequency, and k2 is an integer and k2≥2. That is, the fourth frequency is less than the second frequency, and the second frequency is an integer multiple of the fourth frequency. The shift register circuit 2 further includes a fourth unit group 11. The shift units 3 in the fourth unit group 11 are electrically connected to the pixel circuits 1 in the fourth sub-region DA4 (not shown in FIG. 8).

In the second-type first sub-mode FM1-2, for every k2×x1 adjacent frames, in each of the k2×x1 frames, the fourth unit group 11 and the first unit group 6 sequentially output the active scanning level. In x1 frames of the frames, after the first unit group 6 outputs the active scanning level, the shift units 3 in the second unit group 7 sequentially output the active scanning level. In the remaining (k2−1)×x1 frames, the control circuit 5 in the first shift unit 8 provides the non-enabling level to the first node N1 at least after the first unit group 6 outputs the active scanning level. In addition, for every k2×x1 adjacent frames, in one of the k2×x1 frames, data voltages are written to the pixel circuits 1 in the fourth sub-region DA4, and in the remaining k2×x1−1 frames, no data voltage is written to the pixel circuits 1 in the fourth sub-region DA4.

It should be noted that, in this embodiment of the present disclosure, that no data voltage is written to the pixel circuits 1 in a particular sub-region in some frames means that in these frames, although the unit group corresponding to this sub-region outputs an active scanning level to the pixel circuits 1 in the sub-region, and data write transistors are turned on accordingly, data lines Data do not provide any data voltage to these pixel circuits 1. Therefore, no data voltage is applied to a driver transistor of the pixel circuit 1 in this sub-region. In this case, data is not refreshed in this sub-region.

As an example, the first frequency and the reference frequency are each 120 Hz, the second frequency is 60 Hz, and the fourth frequency is 30 Hz (x1=2 and k2=2). FIG. 8 is another schematic diagram showing display sub-regions of a display panel in a first sub-mode FM1 according to an embodiment of the present disclosure, and FIG. 9 is a schematic timing diagram corresponding to FIG. 8. As shown in FIG. 8 and FIG. 9, in the second-type first sub-mode FM1-2, four adjacent frames include: an $n^{th}$ frame F_n, an $(n+1)^{th}$ frame F_n+1, an $(n+2)^{th}$ frame F_n+2, and an $(n+3)^{th}$ frame F_n+3. In each of the four frames, the shift units 3 (corresponding to Gout_1 to Gout_p) in the fourth unit group 11 and the first unit group 6 sequentially output the high level. In the $n^{th}$ frame F_n and the $(n+2)^{th}$ frame F_n+2, after the shift units 3 (corresponding to Gout_1 to Gout_p) in the fourth unit group 11 and the first unit group 6 output the high level, the shift units 3 (corresponding to Gout_p+1 to Gout_z) in the second unit group 7 sequentially output the high level. In the $(n+1)^{th}$ frame F_n+1 and the $(n+3)^{th}$ frame F_n+3, after the shift units 3 (corresponding to Gout_1 to Gout_p) in the fourth unit group 11 and the first unit group 6 output the high level, the first shift unit 8 (corresponding to Gout_p+1) cuts off the shift path from the first unit group 6 to the second unit group 7, such that the shift units 3 (corresponding to Gout_p+1 to Gout_z) in the second unit group 7 do not output the high level. In addition, in the four adjacent frames: the $n^{th}$ frame F_n, the $(n+1)^{th}$ frame F_n+1, the $(n+2)^{th}$ frame F_n+2, and the $(n+3)^{th}$ frame F_n+3, although the shift units 3 (corresponding to Gout_1 to Gout_i) in the fourth unit group 11 output the high level to the pixel circuits 1 in the fourth sub-region DA4 in each frame, only in one of the four frames, the data lines Data provide the data voltages to the pixel circuits 1 in the fourth sub-region DA4, such that data can be refreshed in the fourth sub-region DA4. In the remaining three frames, the data lines Data do not provide any data voltage to the pixel circuits 1 in the fourth sub-region DA4. In the three frames, no data voltage is written to the pixel circuits 1 in the fourth sub-region DA4, and consequently, data cannot be refreshed in the fourth sub-region DA4. For example, referring to FIG. 9, data voltages are written to the fourth sub-region DA4 in the $n^{th}$ frame F_n, and are not written to the fourth sub-region DA4 in the $(n+1)^{th}$ frame F_n+1, the $(n+2)^{th}$ frame F_n+2, and the $(n+3)^{th}$ frame F_n+3. Alternatively, data voltages are written to the fourth sub-region DA4 in the $(n+1)^{th}$ frame F_n+1, and are not written in the fourth sub-region DA4 in the $n^{th}$ frame F_n, the $(n+2)^{th}$ frame F_n+2, and the $(n+3)^{th}$ frame F_n+3.

In the four adjacent frames, data refreshing is performed four times in the first sub-region DA1, data refreshing is performed twice in the second sub-region DA2, and data refreshing is performed only once in the third sub-region DA3. In this way, the frequency of the first sub-region DA1 is twice of the frequency of the second sub-region DA2 and four times of the frequency of the fourth sub-region DA4.

The foregoing arrangement can enable the display panel to perform display in three sub-regions at different frequencies in the second-type first sub-mode FM1-2, for example with a high frequency in the middle sub-region and low frequencies in the upper and lower sub-regions. Compared with the display in two sub-regions at different frequencies, this partition display manner is more flexible, suitable for more application scenarios. For example, a video screen may be displayed at a high frequency in the middle, sub-region, a static screen such as a black border may be displayed at an ultra-low frequency in the upper sub-region, and a comment screen may be displayed at a low frequency in the lower sub-region. In addition, this display mode allows more precise control of frequencies at different positions of the display region DA to reduce power consumption to a greater extent.

Figure 10:
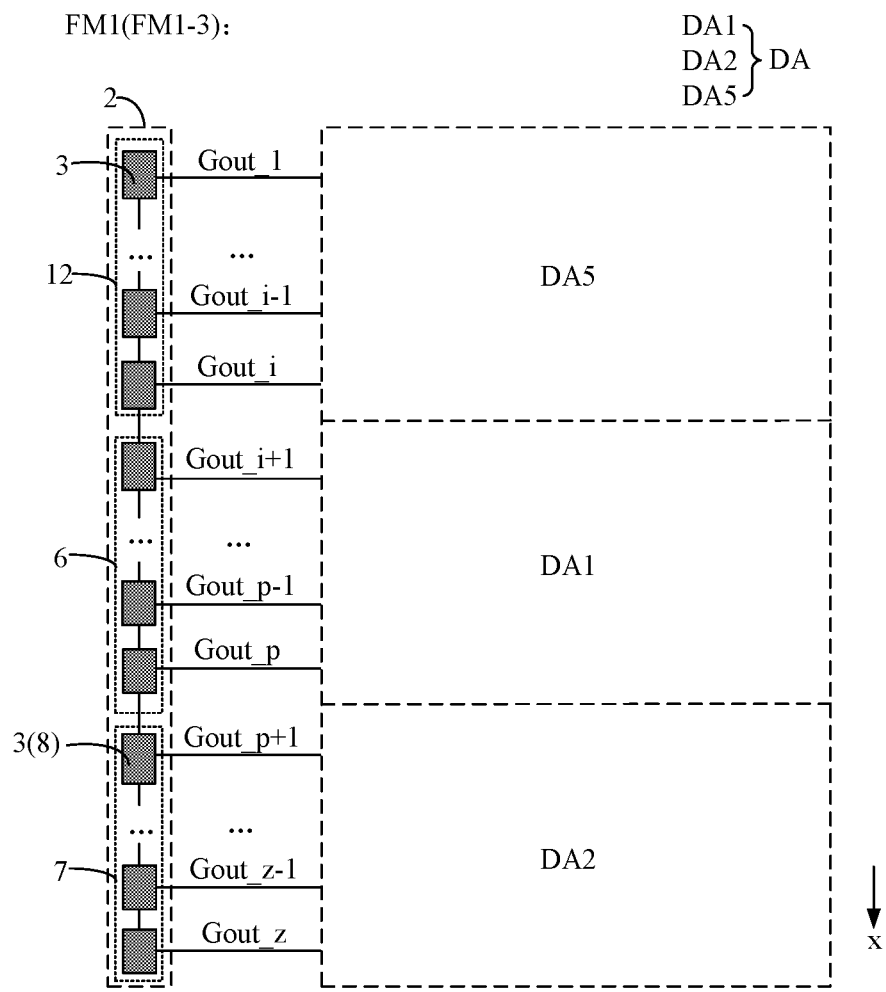
FIG. 10 is a schematic diagram illustrating display regions of a display panel in a third-type first sub-mode according to an embodiment of the present disclosure.
Figure 11:
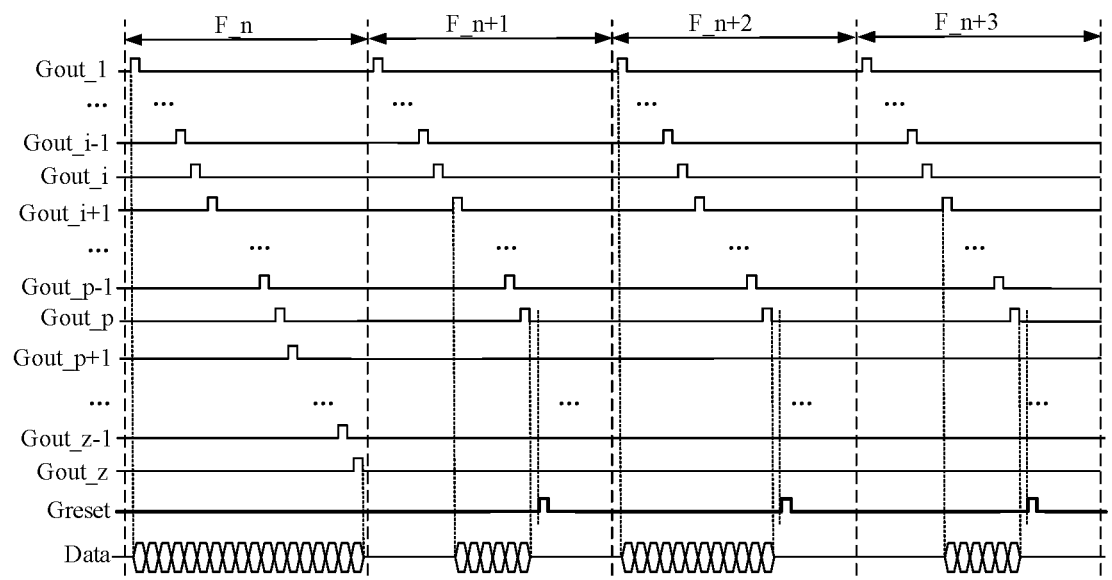
FIG. 11 is a schematic timing diagram corresponding to FIG. 10.

In some embodiments, with reference to FIG. 10 and FIG. 11, the at least one first sub-mode FM1 includes a third-type first sub-mode FM1-3. In the third-type first sub-mode FM1-3, the display region DA further includes a fifth sub-region DA5 that is adjacent to the first sub-region DA1 in the first direction x. The fifth sub-region DA5 and the second sub-region DA2 are located at two opposite sides of the first sub-region DA1. The scanning direction of the display region DA is from the fifth sub-region DA5 to the second sub-region DA2. Data refreshing is performed at a fifth frequency in the fifth sub-region DA5. f5=k3×f2, f5 is the fifth frequency, and k3 is an integer and k3≥2. That is, the fifth frequency is greater than the second frequency, and the fifth frequency is an integer multiple of the second frequency. The shift register circuit 2 further includes a fifth unit group 12. The shift units 3 in the fifth unit group 12 are electrically connected to the pixel circuits 1 in the fifth sub-region DA5 (not shown in FIG. 10).

In the third-type first sub-mode FM1-3, for every x1 adjacent frames, in each of the x1 frames, the fifth unit group 12 and the first unit group 6 sequentially output the active scanning level. In one of the x1 frames, after the first unit group 6 outputs the active scanning level, the second unit group 7 sequentially outputs the active scanning level. In the remaining x1-1 frames, the control circuit 5 in the first shift unit 8 provides the non-enabling level to the first node N1 at least after the first unit group 6 outputs the active scanning level. In addition, for every x1 adjacent frames, in one frame of any k3 adjacent frames of the x1 frames, data voltages are written to the pixel circuits 1 in the fifth sub-region DA5, and in the remaining k3-1 frames, no data voltage is written to the pixel circuits 1 in the fifth sub-region DA5.

As an example, the first frequency and the reference frequency are each 120 Hz, the second frequency is 30 Hz, and the fifth frequency is 60 Hz (x1=4 and k3=2). FIG. 10 is a schematic diagram showing display sub-regions of a display panel in a third-type first sub-mode FM1-3 according to an embodiment of the present disclosure, and FIG. 11 is a schematic timing diagram corresponding to FIG. 10. As shown in FIG. 10 and FIG. 11, in the third-type first sub-mode FM1-3, four adjacent frames include: an $n^{th}$ frame F_n, an $(n+1)^{th}$ frame F_n+1, an $(n+2)^{th}$ frame F_n+2, and an $(n+3)^{th}$ frame F_n+3. In each of the four frames, the shift units 3 (corresponding to Gout_1 to Gout_p) in the fifth unit group 12 and the first unit group 6 sequentially output the high level. In the $n^{th}$ frame F_n, after the shift units 3 (corresponding to Gout_1 to Gout_p) in the fifth unit group 12 and the first unit group 6 sequentially output the high level, the shift units 3 (corresponding to Gout_p+1 to Gout_z) in the second unit group 7 sequentially output the active scanning level. In the $(n+1)^{th}$ frame F_n+1, the $(n+2)^{th}$ frame F_n+2, and the $(n+3)^{th}$ frame F_n+3, after the shift units 3 (corresponding to Gout_1 to Gout_p) in the fifth unit group 12 and the first unit group 6 sequentially output the high level, the first shift unit 8 (corresponding to Gout_p+1) cuts off the shift path between the first unit group 6 and the second unit group 7, and the shift units 3 (corresponding to Gout_p+1 to Gout_z) in the second unit group 7 do not output the high level. In addition, for the four adjacent frames: the n th frame F_n, the $(n+1)^{th}$ frame F_n+1, the $(n+2)^{th}$ frame F_n+2, and the $(n+3)^{th}$ frame F_n+3, in each of the four frames, the shift units 3 (corresponding to Gout_1 to Gout_i) in the fifth unit group 12 output the high level to the pixel circuits 1 in the fifth sub-region DA5. However, referring to FIG. 11, only in the $n^{th}$ frame F_n and the $(n+2)^{th}$ frame F_n+2, data lines Data provide data voltages to the pixel circuits 1 in the fifth sub-region DA5, such that data can be refreshed in the fifth sub-region DA5. In the $(n+1)^{th}$ frame F_n+1 and the $(n+3)^{th}$ frame F_n+3, the data lines Data do not provide the data voltages to the pixel circuits 1 in the fifth sub-region DA5, such that data cannot be refreshed in the fifth sub-region DA5. Alternatively, only in the $(n+1)^{th}$ frame F_n+1 and the $(n+3)^{th}$ frame F_n+3, the data lines Data provide data voltages to the pixel circuits 1 in the fifth sub-region DA5, such that data can be refreshed in the fifth sub-region DA5. In the $n^{th}$ frame F_n and the $(n+2)^{th}$ frame F_n+2, the data lines Data do not provide data voltages to the pixel circuits 1 in the fifth sub-region DA5, such that data cannot be refreshed in the fifth sub-region DA5.

In the four adjacent frames, data refreshing is performed for four times in the first sub-region DA1, data refreshing is performed once in the second sub-region DA2, and data refreshing is performed twice in the third sub-region DA3. In this way, the frequency of the first sub-region DA1 is four times the frequency of the second sub-region DA2 and twice the frequency of the fifth sub-region DA5.

The foregoing arrangement can enable the display panel to perform display in three sub-regions at different frequencies in the third-type first sub-mode FM1-3, for example, with a high frequency in the middle sub-region and low frequencies in the upper and lower sub-regions. Compared with the display in two sub-regions at different frequencies, this partition display manner is more flexible, suitable for more application scenarios. For example, a video screen may be displayed at a high frequency in the middle sub-region, a comment screen may be displayed at a low frequency in the upper sub-region, and a static screen such as a black border may be displayed at an ultra-low frequency in the lower sub-region. In addition, this display mode allows more precise control of frequencies at different positions of the display region DA to reduce power consumption to a greater extent.

Figure 12:
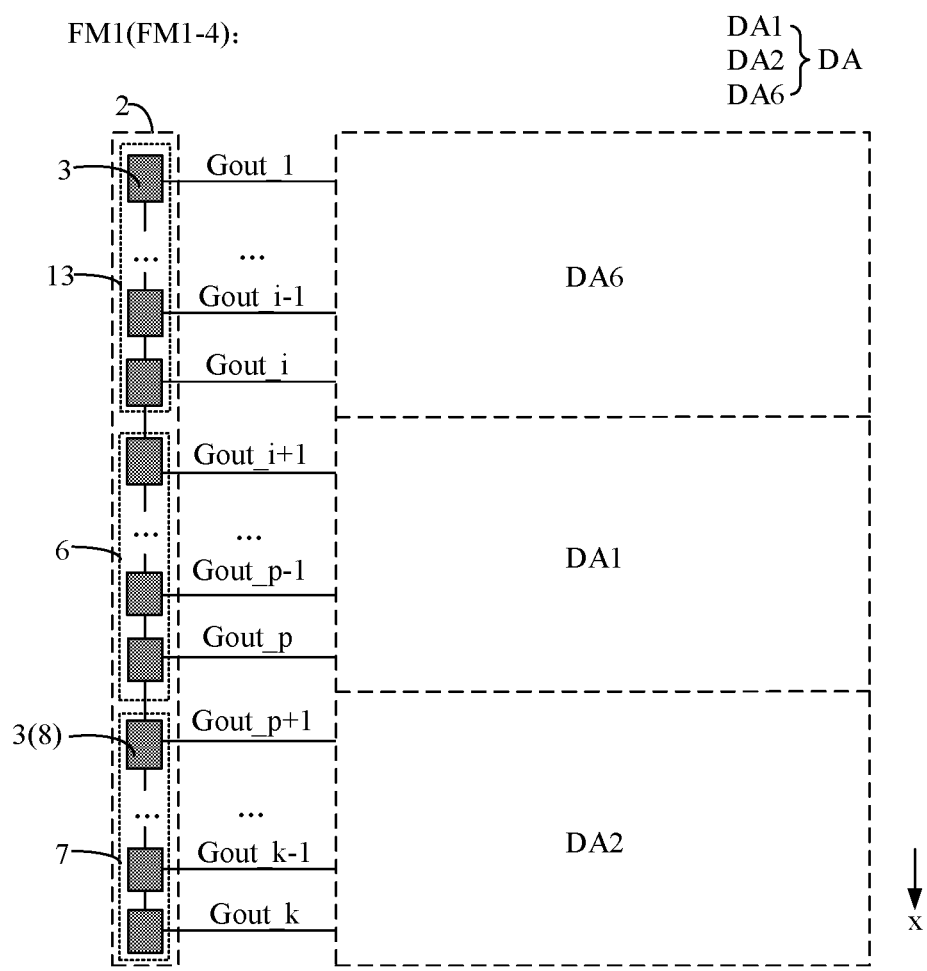
FIG. 12 is a schematic diagram illustrating display regions of a display panel in a fourth-type first sub-mode according to an embodiment of the present disclosure.
Figure 13:
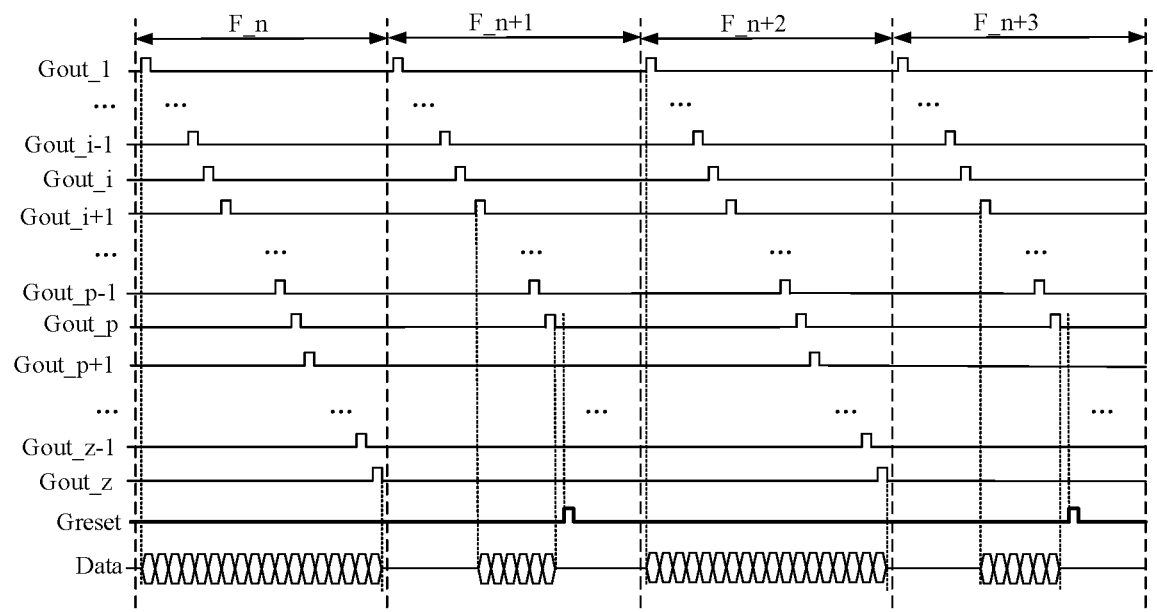
FIG. 13 is a schematic timing diagram corresponding to FIG. 12.

In some embodiments, with reference to FIG. 12 and FIG. 13, the at least one first sub-mode FM1 includes a fourth-type first sub-mode FM1-4. In the fourth-type first sub-mode FM1-4, the display region DA further includes a sixth sub-region DA6 that is adjacent to the first sub-region DA1 in the first direction x. The sixth sub-region DA6 and the second sub-region DA2 are located at two opposite sides of the first sub-region DA1. The scanning direction of the display region DA is from the sixth sub-region DA6 to the second sub-region DA2. Data refreshing is performed at a second frequency in the sixth sub-region DA6. The shift register circuit 2 further includes a sixth unit group 13. The shift units 3 in the sixth unit group 13 are electrically connected to the pixel circuits 1 in the sixth sub-region DA6 (not shown in FIG. 12).

In the fourth-type first sub-mode FM1-4, for every x1 adjacent frames, in each of the x1 frames, the sixth unit group 13 and the first unit group 6 sequentially output the active scanning level. In one of the x1 frames, after the first unit group 6 outputs the active scanning level, the shift units 3 in the second unit group 7 sequentially outputs the active scanning level. In the remaining x1-1 frames, the control circuit 5 in the first shift unit 8 supplies the non-enabling level to the first node N1 at least after the first unit group 6 outputs the active scanning level. In addition, for every x1 adjacent frames, in one of the x1 frames, data voltages are written to the pixel circuits 1 in the sixth sub-region DA6, and in the remaining x1-1 frames, no data voltage is written to the pixel circuits 1 in the sixth sub-region DA6.

As an example, the first frequency and the reference frequency are each 120 Hz, and the second frequency is 60 Hz (x1=2). FIG. 12 is a schematic diagram showing display sub-regions of a display panel in a fourth-type first sub-mode FM1-4 according to an embodiment of the present disclosure, and FIG. 13 is a schematic timing diagram corresponding to FIG. 12. As shown in FIG. 12 and FIG. 13, in the fourth-type first sub-mode FM1-4, for two adjacent frames: an $n^{th}$ frame F_n and an $(n+1)^{th}$ frame F_n+1, in the $n^{th}$ frame F_n and the $(n+1)^{th}$ frame F_n+1, the shift units 3 (corresponding to Gout_1 to Gout_p) in the sixth unit group 13 and the first unit group 6 sequentially output the high level. In the $n^{th}$ frame F_n, after the shift units 3 (corresponding to Gout_1 to Gout_p) in the sixth unit group 13 and the first unit group 6 sequentially output the high level, the shift units 3 (corresponding to Gout_p+1 to Gout_z) in the second unit group 7 sequentially output the active scanning level. In the $(n+1)^{th}$ frame F_n+1, after the shift units 3 (corresponding to Gout_1 to Gout_p) in the sixth unit group 13 and the first unit group 6 sequentially output the high level, the first shift unit 8 (corresponding to Gout_p+1) cuts off the shift path between the first unit group 6 and the second unit group 7, and the shift units 3 (corresponding to Gout_p+1 to Gout_z) in the second unit group 7 do not output the high level. In addition, for the adjacent $n^{th}$ frame F_n and $(n+1)^{th}$ frame F_n+1, in each of the two frames, the shift units 3 (corresponding to Gout_1 to Gout_i) in the sixth unit group 13 output the high level to the pixel circuits 1 in the sixth sub-region DA6. However, referring to FIG. 13, only in the $n^{th}$ frame F_n, data lines Data supply data voltages to the pixel circuits 1 in the sixth sub-region DA6, such that data can be refreshed in the sixth sub-region DA6.

In the $(n+1)^{th}$ frame F_n+1, the data lines Data do not supply the data voltages to the pixel circuits 1 in the sixth sub-region DA6, such that data cannot be refreshed in the sixth sub-region DA6. Alternatively, only in the $(n+1)^{th}$ frame F_n+1, data lines Data supply data voltages to the pixel circuits 1 in the sixth sub-region DA6, such that data can be refreshed in the sixth sub-region DA6, whereas in the $n^{th}$ frame F_n, the data lines Data do not supply the data voltages to the pixel circuits 1 in the sixth sub-region DA6, such that data cannot be refreshed in the sixth sub-region DA6.

That is, in the two adjacent frames, data refreshing is performed twice in the first sub-region DA1, and data refreshing is performed once in both the second sub-region DA2 and the sixth sub-region DA6. In this way, the frequency of the first sub-region DA1 is twice the frequency of each of the second sub-region DA2 and the sixth sub-region DA6.

The foregoing arrangement can enable the display panel to perform display in three sub-regions at different frequencies in the fourth-type first sub-mode FM1-4, for example, perform display with a high frequency in the middle sub-region and low frequencies in the upper and lower sub-regions. Compared with the display in two sub-regions at different frequencies, this partition display manner is more flexible, suitable for more application scenarios. For example, a video screen may be displayed at a high frequency in the middle sub-region, and a comment screen and a static screen such as a black border may be displayed at a same low frequency in the upper and lower sub-regions, respectively. In addition, this display mode allows more precise control of frequencies at different positions of the display region DA to reduce power consumption to a greater extent.

Figure 14:
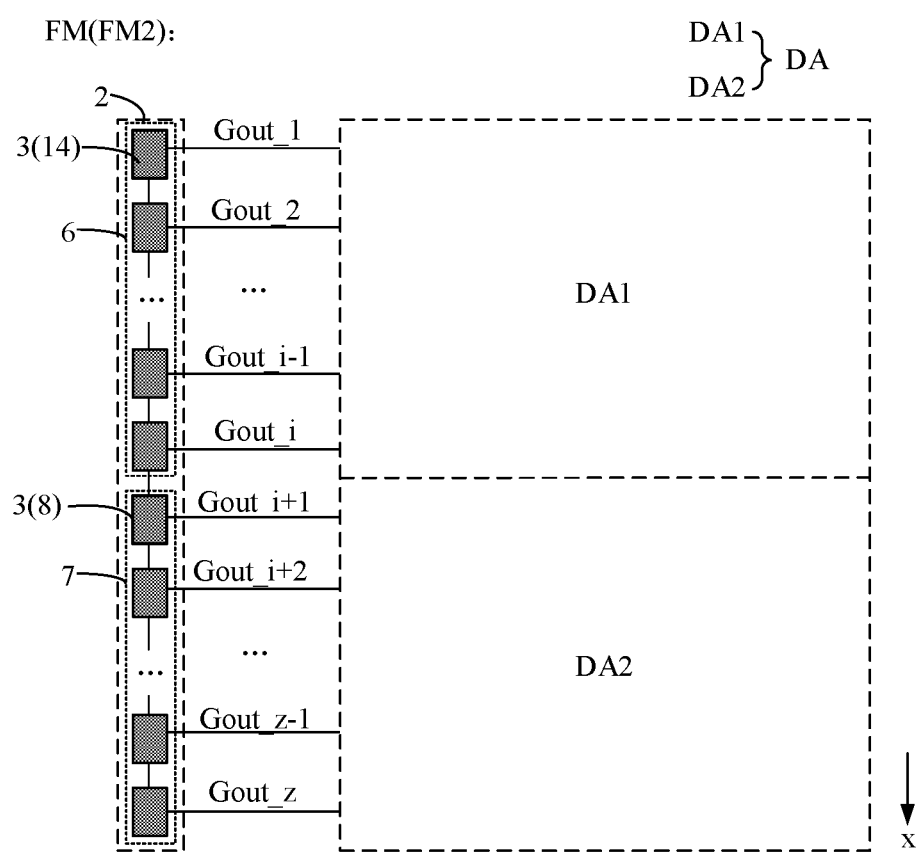
FIG. 14 is a schematic diagram illustrating display regions of a display panel in a second sub-mode according to an embodiment of the present disclosure.
Figure 15:
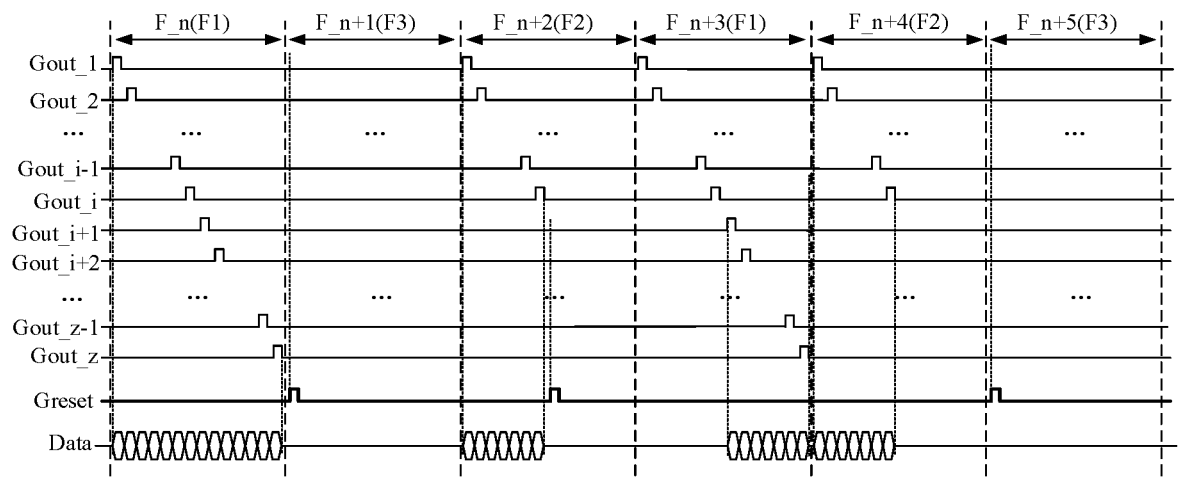
FIG. 15 is a schematic timing diagram corresponding to FIG. 14.

In some embodiments, with reference to FIG. 14 and FIG. 15, the first mode FM includes a second sub-mode FM2. In the second sub-mode FM2, the first frequency is a non-integer multiple of the second frequency, the reference frequency is m1 times of the first frequency, and the reference frequency is m2 times of the second frequency. For example, the reference frequency is 240 Hz, the first frequency is 120 Hz, the second frequency is 80 Hz, m1=2, and m2=3.

In the second sub-mode FM2, every m1×m2 adjacent frames include m1 first frames F1, m2-1 second frames F2, and m1×m2−m1−(m2−1) third frames F3. In the first frame F1, the first unit group 6 and the second unit group 7 sequentially output the active scanning level. In m1-1 first frames F1 of the m1×m2 first frames F1, no data voltage is written to the pixel circuits in the first sub-region DA1. In the second frame F2, the first unit group 6 outputs the active scanning level, and the control circuit 5 in the first shift unit 8 supplies the non-enabling level to the first node N1 at least after the first unit group 6 outputs the active scanning level. In the third frame F3, the control circuit 5 in a third shift unit 14 supplies the non-enabling level to the first node N1. The third shift unit 14 is a shift unit 3 farthest away from the second unit group 7 in the first unit group 6.

As an example, the reference frequency is 240 Hz, the first frequency is 120 Hz, and the second frequency is 80 Hz (m1=2 and m2=3). FIG. 14 is a schematic diagram showing displsy sub-regions of a display panel in a second sub-mode FM2 according to an embodiment of the present disclosure, and FIG. 15 is a schematic timing diagram corresponding to FIG. 14. As shown in FIG. 14 and FIG. 15, in the second sub-mode FM2, there are six adjacent frames: an $n^{th}$ frame F_n, an $(n+1)^{th}$ frame F_n+1, an $(n+2)^{th}$ frame F_n+2, an $(n+3)^{th}$ frame F_n+3, an $(n+4)^{th}$ frame, and an $(n+5)^{th}$ frame. The $n^{th}$ frame F_n and the $(n+3)^{th}$ frame F_n+3 are first frames F1, the $(n+2)^{th}$ frame F_n+2 and the $(n+4)^{th}$ frame are second frames F2, and the $(n+1)^{th}$ frame F_n+1 and the $(n+5)^{th}$ frame are third frames F3.

In the $n^{th}$ frame F_n and the $(n+3)^{th}$ frame F_n+3 (first frames F1), the shift units 3 (corresponding to Gout_1 to Gout_z) in the first unit group 6 and the second unit group 7 sequentially output the active scanning level. In the $(n+3)^{th}$ frame F_n+3, no data voltage is written to the pixel circuits in the first sub-region DA1. In the $(n+2)^{th}$ frame F_n+2 and the $(n+4)^{th}$ frame F_n+4 (second frames F2), the shift units 3 (corresponding to Gout_1 to Gout_i) in the first unit group 6 output the high level. The first shift unit 8 (corresponding to Gout_i+1) cuts off the shift path from the first unit group 6 to the second unit group 7, such that the shift units 3 (corresponding to Gout_i+1 to Gout_z) in the second unit group 7 cannot output the high level. In the $(n+1)^{th}$ frame F_n+1 and the $(n+5)^{th}$ frame F_n+5 (third frames F3), the third shift unit 14 controls all the shift units 3 (corresponding to Gout_1 to Gout_z) in the first unit group 6 and the second unit group 7 not to output the high level.

That is, in the six adjacent frames, data refreshing is performed for three times in the first sub-region DA1, and data refreshing is performed twice in the second sub-region DA2. In this way, the frequencies of the first sub-region DA1 and the second sub-region DA2 are not in an integer-multiple relationship.

In the foregoing arrangement, the frequencies of the first sub-region DA1 and the second sub-region DA2 may not be in an integer-multiple relationship, such that limitations on the frequency design of the two sub-regions can be reduced, thereby making the frequency design of the two sub-regions more flexible.

When the first frequency is a non-integer multiple of the second frequency, the reference frequency may be a least common multiple of the first frequency and the second frequency, to prevent the reference frequency from being set too larger, thereby reducing a requirement on a frequency of the display panel.

Figure 16:
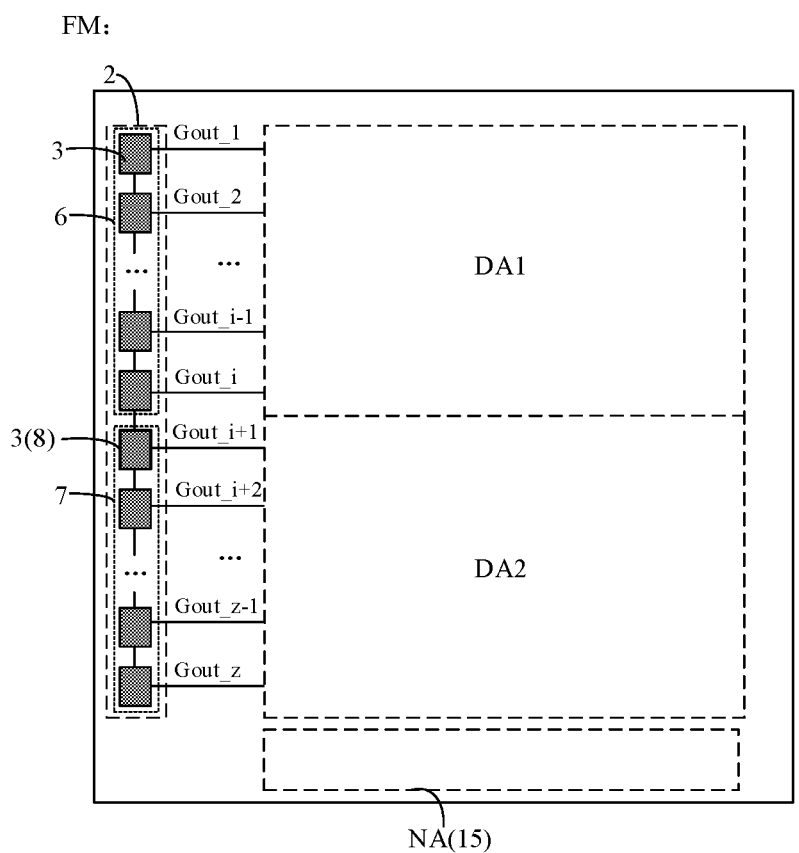
FIG. 16 is a schematic diagram illustrating display regions of a display panel according to an embodiment of the present disclosure.
Figure 17:
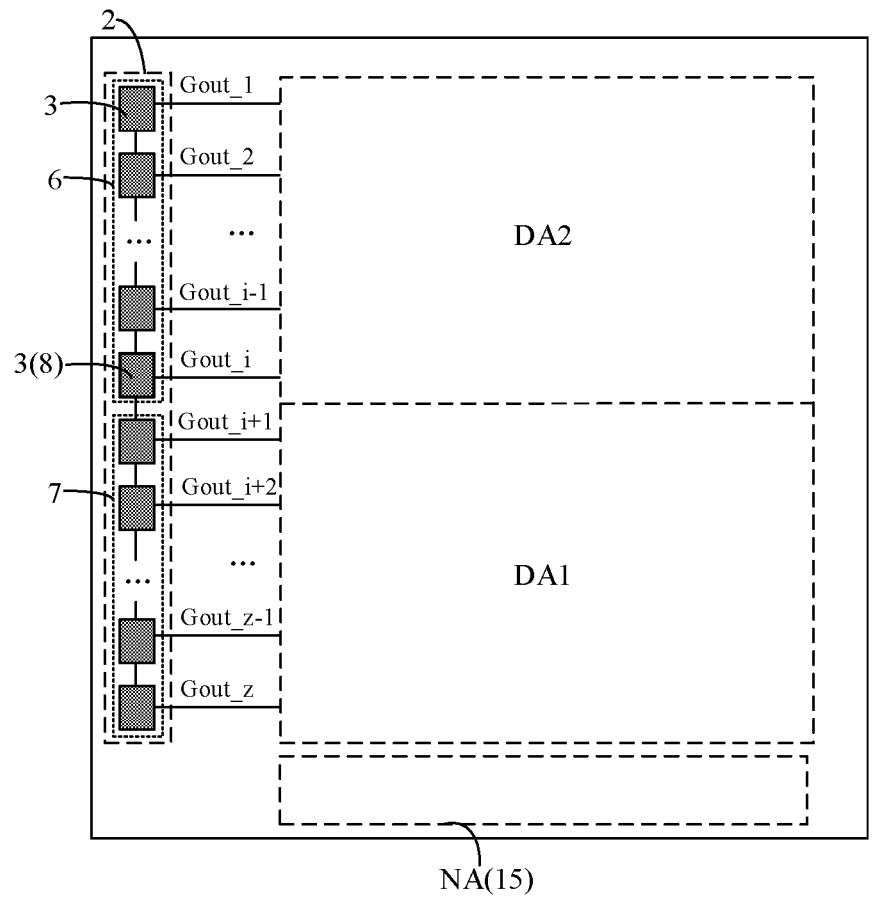
FIG. 17 is another schematic diagram illustrating display regions of a display panel according to an embodiment of the present disclosure.

FIG. 16 is a schematic diagram showing display sub-regions of a display panel according to an embodiment of the present disclosure, and FIG. 17 is another schematic diagram showing display sub-regions of a display panel according to an embodiment of the present disclosure. In some embodiments, as shown in FIG. 16 and FIG. 17, the non-display region NA includes a pin region 15. Pins and other structures are arranged in the pin region 15. A scanning direction of the display region DA is from the first sub-region DA1 to the second sub-region DA2. Referring to FIG. 16, the first sub-region DA1 is located at a side of the second sub-region DA2 away from the pin region 15. Alternatively, referring to FIG. 17, the first sub-region DA1 is located at a side of the second sub-region DA2 adjacent to the pin region 15.

In this embodiment of the present disclosure, the first sub-region DA1 with a higher refreshing frequency may be flexibly and selectively arranged at the upper part or lower part of the screen according to forward or reverse scanning by the shift register circuit 2. For example, the first sub-region DA1 with a higher refreshing frequency may be located at the upper part of the screen, and the shift register circuit 2 performs forward scanning, such that a dynamic screen such as a game or a video can be displayed at the upper part of the screen. Alternatively, the first sub-region DA1 with a higher refreshing frequency may be located at the lower part of the screen, and the shift register circuit 2 perform reverse scanning, such that a game or a video can be displayed at the lower part of the screen. In this way, the position of the sub-region with a higher refreshing frequency in the display region DA can be more flexible.

In some embodiments, with reference to FIG. 2 and FIG. 3, the control circuits 5 in the plurality of shift units 3 are electrically connected to a control signal line Greset. The control circuit 5 is configured to provide the non-enabling level to the first node N1 in response to a conduction level provided by the control signal line Greset. In the first mode FM, in some frames, the control signal line Greset provides a non-conduction level, and in some frames, after the first unit group 6 outputs the active scanning level, the control signal line Greset provides the conduction level.

In this structure, the control circuits 5 of all the shift units 3 in the shift register circuit 2 are connected to only one control signal line Greset, with a relatively small quantity of new signal lines added. Based on this structure, in some frames, when the first shift unit 8 needs to cut off the shift path from the first unit group 6 to the second unit group 7, it is only necessary to cause the control signal line Greset to provide the conduction level after the first unit group 6 outputs the active scanning level. In this case, although the control circuits 5 in all the shift units 3 supply the non-enabling level to the corresponding first nodes N1, normal working of the first unit group 6 is not affected because the shift units 3 in the first unit group 6 have output the active scanning level.

Figure 18:
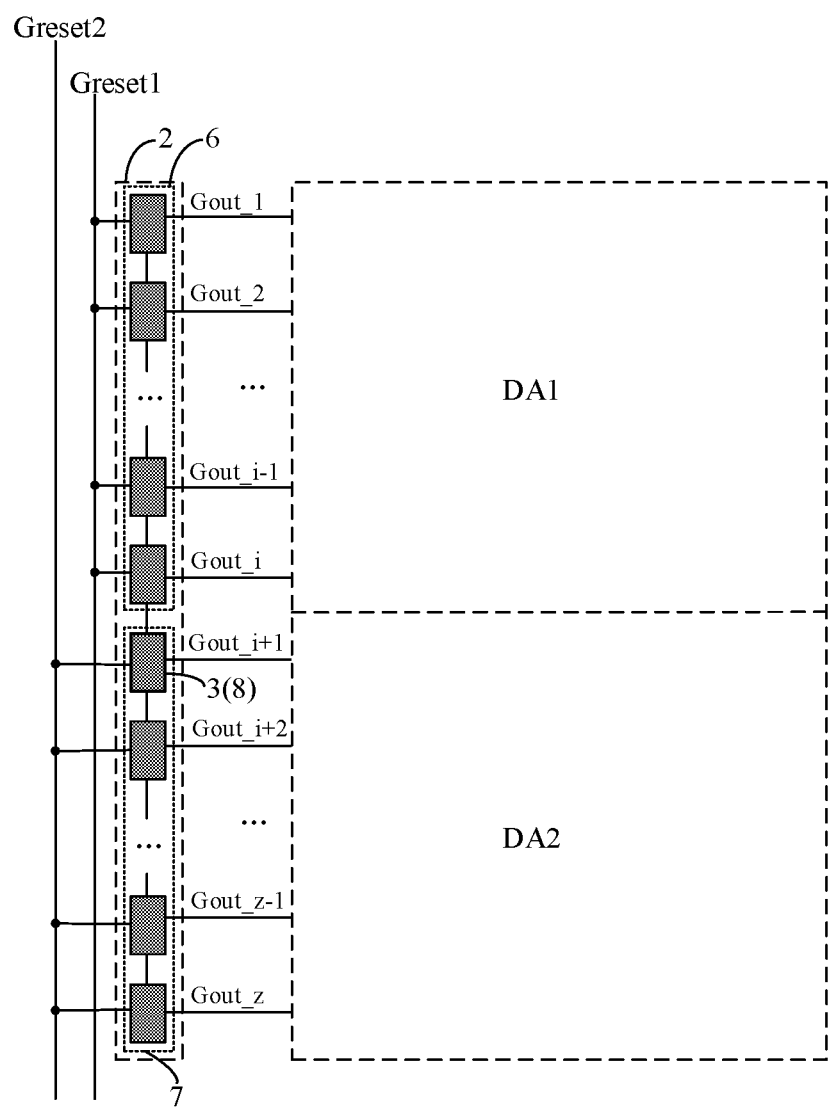
FIG. 18 is another schematic structural diagram of a shift register circuit according to an embodiment of the present disclosure.
Figure 19:
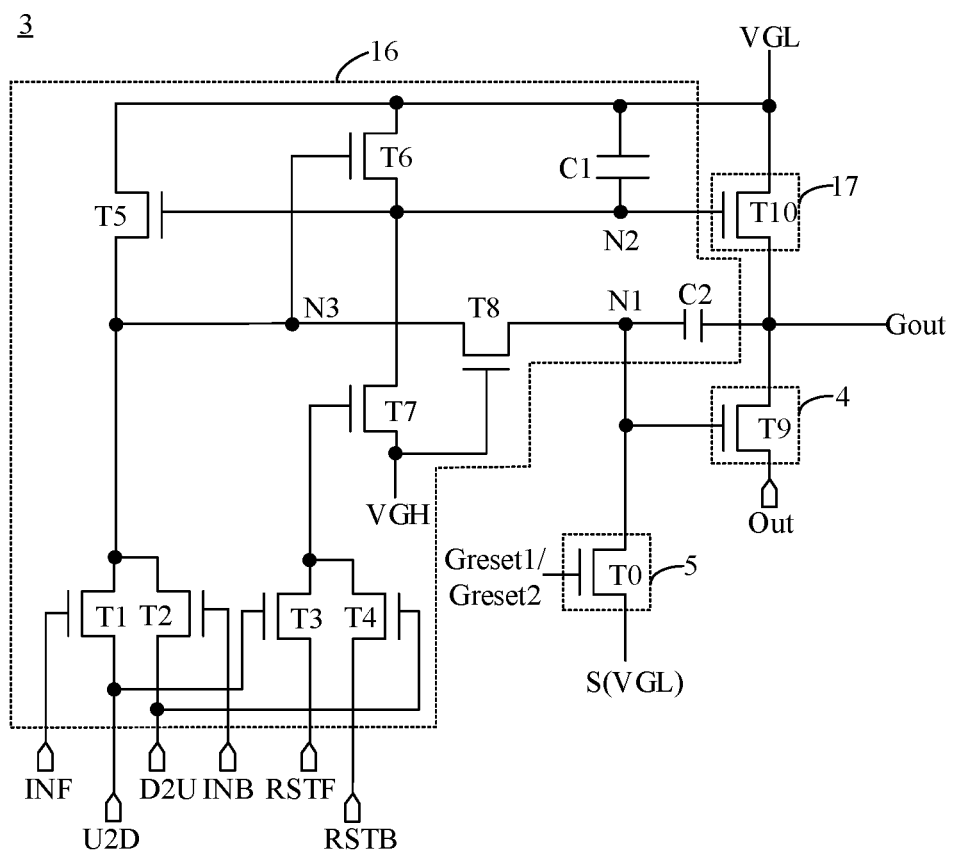
FIG. 19 is a schematic diagram of another circuit structure of a shift unit according to an embodiment of the present disclosure.
Figure 20:
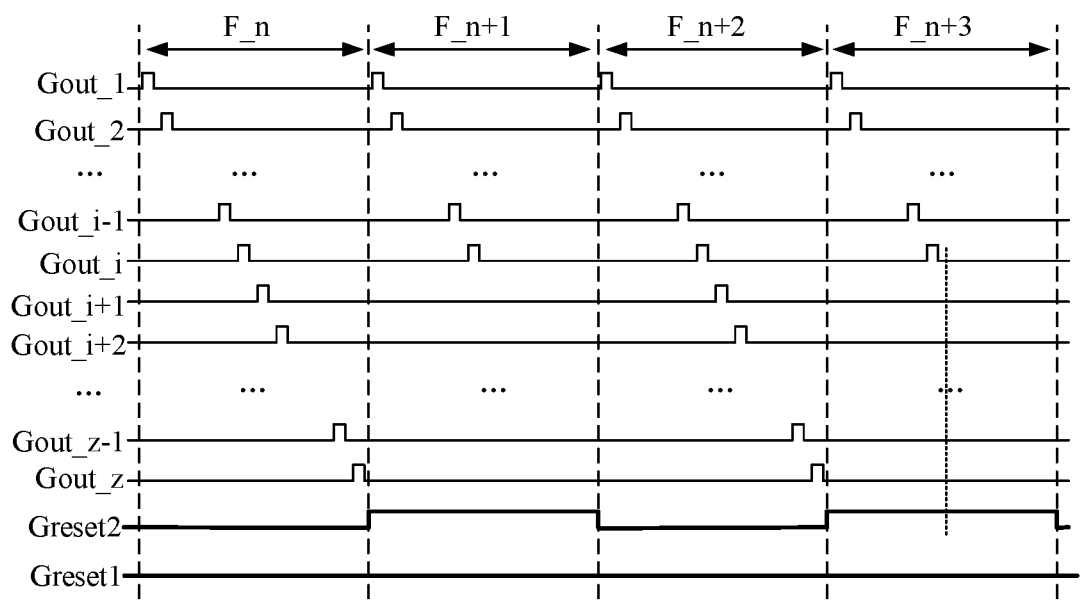
FIG. 20 is a timing diagram corresponding to FIG. 18.

FIG. 18 is another schematic structural diagram of a shift register circuit 2 according to an embodiment of the present disclosure, FIG. 19 is a schematic diagram of another circuit structure of a shift unit 3 according to an embodiment of the present disclosure, and FIG. 20 is a timing diagram corresponding to FIG. 18. Alternatively, in some embodiments, as shown in FIG. 18 to FIG. 20, the control circuits 5 in the shift units 3 in the first unit group 6 are electrically connected to a first control signal line Greset1, and the control circuits 5 in the shift units 3 in the second unit group 7 are electrically connected to a second control signal line Greset2. The control circuit 5 is configured to supply the non-enabling level to the corresponding first node N1 in response to a conduction level provided by the first control signal line Greset1 or the second control signal line Greset2. In the first mode FM, the first control signal line Greset1 provides a non-conduction level. In some frames, the second control signal line Greset2 provides a non-conduction level. In some frames, the second control signal line Greset2 provides the conduction level at least after the first unit group 6 outputs the active scanning level. For example, in some frames, after the first unit group 6 outputs the active scanning level, the second control signal line Greset2 then starts to provide the conduction level. Alternatively, referring to FIG. 20, the second control signal line Greset2 has been providing the conduction level from the beginning of a frame.

In this structure, the shift units 3 in the first unit group 6 and the second unit group 7 are connected to different control signal lines Greset. Therefore, the two control signal lines Greset control the first unit group 6 and the second unit group 7 respectively. Specifically, in some frames, when the first shift unit 8 needs to cut off the shift path from the first unit group 6 to the second unit group 7, the second control signal line Greset2 provides the conduction level at the beginning of the frame, such that the first shift unit 8 maintains cutting off the shift path from the first unit group 6 to the second unit group 7 throughout the entire frame without affecting the normal working of the first unit group 6. In this manner, the control circuits 5 in the first unit group 6 and the second unit group 7 are individually controlled, and the circuit works more reliably.

It should be noted that, this structure is suitable for the first mode FM in which the positions of the first sub-region DA1 and the second sub-region DA2 are fixed. In this first mode FM, ranges of the first unit group 6 and the second unit group 7 are also fixed. The first unit group 6 and the second unit group 7 are caused to be connected to different control signal lines, such that in some frames, the first unit group 6 and the second unit group 7 can be controlled to have different working states.

In some embodiments, referring to FIG. 3 and FIG. 19 again, the control circuit 5 includes a control transistor T0. The control transistor T0 is electrically connected between a first signal line S and the first node N1. The first signal line S is configured to transmit the non-enabling level.

The control transistor T0 is turned on in response to a conduction level provided by the control signal line Greset (or a first control signal line Greset1 or a second control signal line Greset2), such that the non-enabling level provided by the first signal line S is supplied to the first node N1, to control the first output circuit 4 not to output the active scanning level again.

In some embodiments, referring to FIG. 2, the shift unit 3 includes a forward direct current scanning control signal terminal U2D, a reverse direct current scanning control signal terminal D2U, a forward scanning reset control signal terminal RSTF, a reverse scanning reset control signal terminal RSTB, and a drive signal terminal OUT. The forward direct current scanning control signal terminal U2D is electrically connected to a forward scanning signal line U2D1. The reverse direct current scanning control signal terminal D2U is electrically connected to a reverse scanning signal line D2U1. The forward scanning reset control signal terminal RSTF, the reverse scanning reset control signal terminal RSTB, and the drive signal terminal OUT are respectively connected to three of a first clock signal line CK1, a second clock signal line CK2, a third clock signal line CK3, and a fourth clock signal line CK4.

In addition, the shift unit 3 further includes a forward shift control terminal INF and a reverse shift control terminal INB. Along the direction from the first sub-region DA1 to the second sub-region DA2, the forward shift control terminal INF of the first shift unit of the cascaded shift units 3 is electrically connected to a first frame-start signal STV1, and the reverse shift control terminal INB of the last one the cascaded shift units 3 is electrically connected to a second frame-start signal STV2. For two adjacent shift units 3, the forward shift control terminal INF of the latter shift unit 3 is electrically connected to an output terminal Gout of the former shift unit 3, and the reverse shift control terminal INB of the former shift unit 3 is electrically connected to an output terminal Gout of the latter shift unit 3, such that the shift register circuit 2 have both forward scanning function and reverse scanning function.

Referring to FIG. 2, for a $(4q+1)^{th}$ shift unit, the reverse scanning reset control signal terminal RSTB is electrically connected to the first clock signal line CK1, the drive signal terminal OUT is electrically connected to the second clock signal line CK2, and the forward scanning reset control signal terminal RSTF is electrically connected to the third clock signal line CK3. For a $(4q+2)^{th}$ shift unit, the reverse scanning reset control signal terminal RSTB is electrically connected to the second clock signal line CK2, the drive signal terminal OUT is electrically connected to the third clock signal line CK3, and the forward scanning reset control signal terminal RSTF is electrically connected to the fourth clock signal line CK4. For a $(4q+3)^{th}$ shift unit, the reverse scanning reset control signal terminal RSTB is electrically connected to the third clock signal line CK3, the drive signal terminal OUT is electrically connected to the fourth clock signal line CK4, and the forward scanning reset control signal terminal RSTF is electrically connected to the first clock signal line CK1. For a $(4q+4)^{th}$ shift unit, the reverse scanning reset control signal terminal RSTB is electrically connected to the fourth clock signal line CK4, the drive signal terminal OUT is electrically connected to the first clock signal line CK1, and the forward scanning reset control signal terminal RSTF is electrically connected to the second clock signal line CK2. A value of q is sequentially set to 0, 1, 2, 3, 4, and so on.

Figure 21:
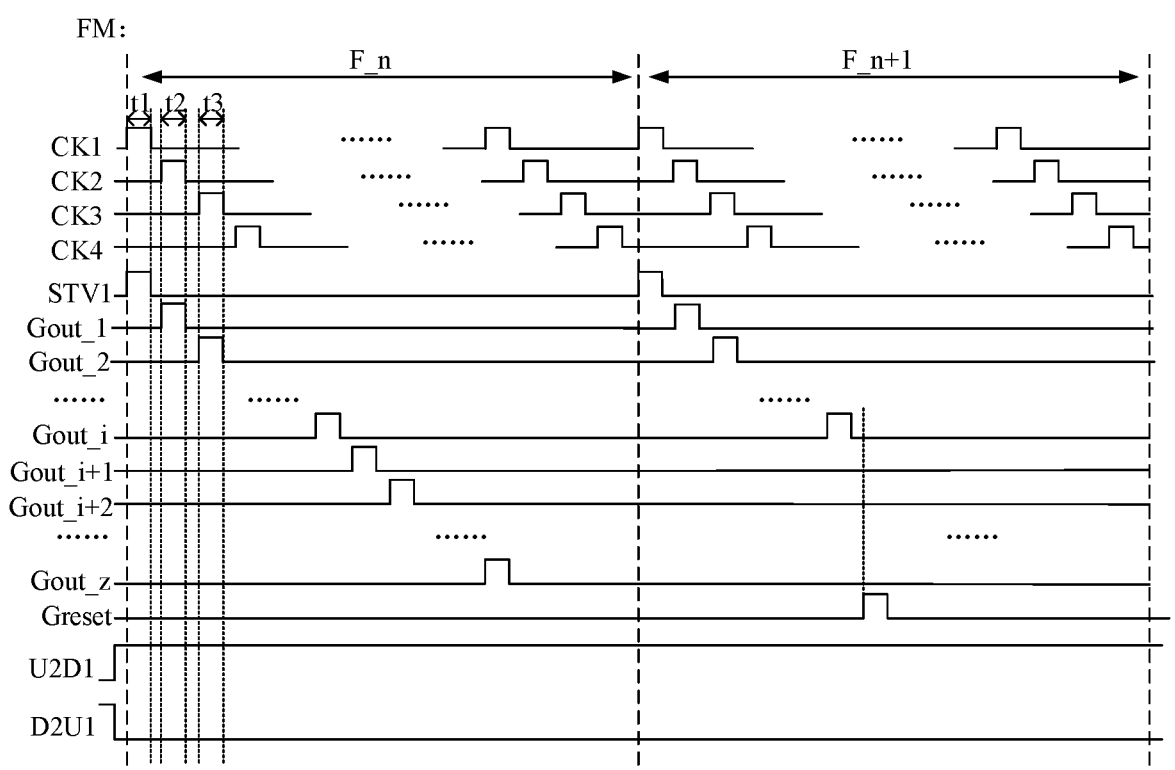
FIG. 21 is a timing diagram corresponding to FIG. 16.

With reference to FIG. 16, when the first sub-region DA1 with a higher refreshing frequency is located at the upper part of the screen, the shift register circuit 2 performs forward scanning. As shown in FIG. 21, FIG. 21 is a timing diagram corresponding to FIG. 16. As an example, the first frequency is twice the second frequency. In the first mode FM, the forward scanning signal line U2D1 provides a high level, and the reverse scanning signal line D2U1 provides a low level. In an $n^{th}$ frame F_n, the shift units 3 (corresponding to Gout_1 to Gout_z) in the first unit group 6 and the second unit group 7 sequentially output a high level, and the control signal line Greset provides a low level. In an $(n+1)^{th}$ frame F_n+1, after the shift units 3 (corresponding to Gout_1 to Gout_i) in the first unit group 6 output a high level, the control signal line Greset provides a high level, such that the control circuit 5 in the first shift unit 8 provides a low level to the first node N1, thereby causing the shift units 3 (corresponding to Gout_i+1 to Gout_z) in the second unit group 7 not to output a high level.

Figure 22:
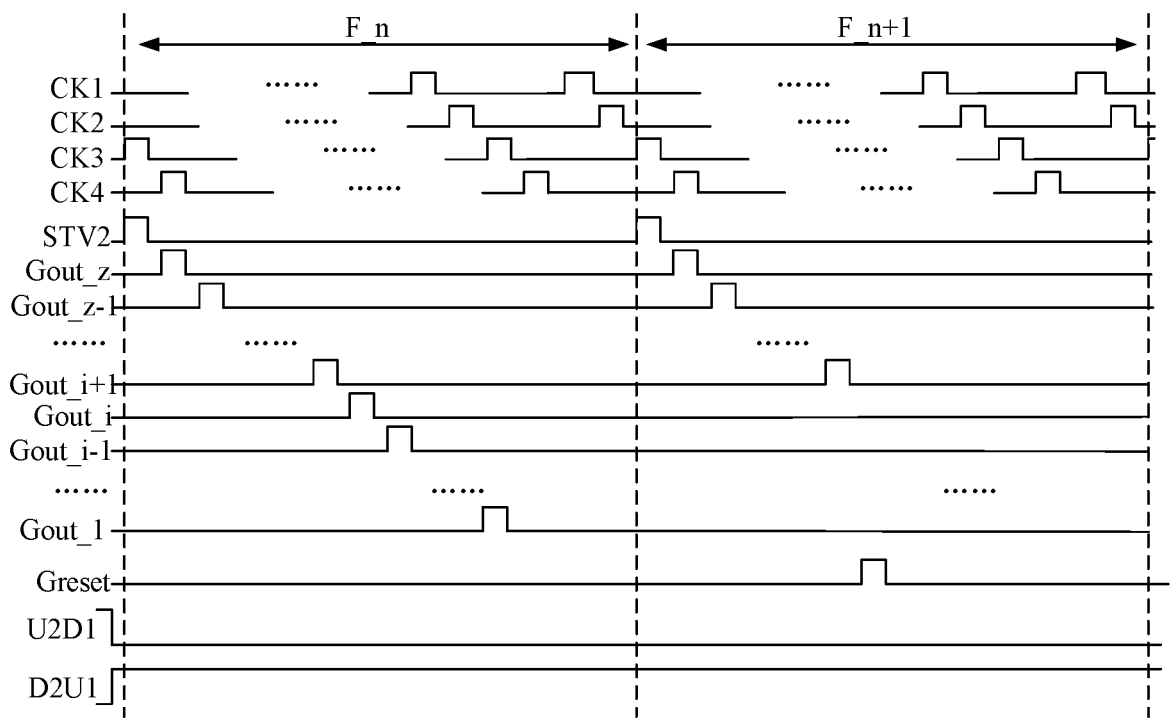
FIG. 22 is a timing diagram corresponding to FIG. 17.

With reference to FIG. 17, when the first sub-region DA1 with a higher refreshing frequency is located at the lower part of the screen, the shift register circuit 2 performs reverse scanning. As shown in FIG. 22, FIG. 22 is a timing diagram corresponding to FIG. 17. As an example, the first frequency is twice the second frequency. In the first mode FM, the forward scanning signal line U2D1 provides a low level, and the reverse scanning signal line D2U1 provides a high level. In an $n^{th}$ frame F_n, the shift units 3 (corresponding to Gout_z to Gout_1) in the first unit group 6 and the second unit group 7 sequentially output a high level, and the control signal line Greset provides a low level. In an $(n+1)^{th}$ frame F_n+1, after the shift units 3 (corresponding to Gout_i+1 to Gout_z) in the first unit group 6 output a high level, the control signal line Greset provides a high level, such that the control circuit 5 in the first shift unit 8 provides a low level to the first node N1, thereby causing the shift units 3 (corresponding to Gout_i to Gout_1) in the second unit group 7 not to output a high level.

In some embodiments, referring to FIG. 2 again, the shift units 3 are electrically connected to clock signal lines. The clock signal lines may specifically include the first clock signal line CK1, the second clock signal line CK2, the third clock signal line CK3, and the fourth clock signal line CK4 described above. In the first mode FM, in some frames, after the first unit group 6 outputs the active scanning level, the control circuit 5 in the first shift unit 8 supplies the non-enabling level to the first node N1, and the clock signal line stops providing any signal, to further reduce power consumption.

In some embodiments, referring to FIG. 3 and FIG. 19 again, the shift unit 3 further includes a driver circuit 16 and a second output circuit 17. The driver circuit 16 is configured to provide the enabling level or the non-enabling level to the first node N1, and provide the enabling level or the non-enabling level to a second node N2. The second output circuit 17 is configured to output the inactive scanning level in response to the enabling level of the second node N2.

In an embodiment, the driver circuit 16 may include a first transistor T1, a second transistor T2, a third transistor T3, a fourth transistor T4, a fifth transistor T5, a sixth transistor T6, a seventh transistor T7, an eighth transistor T8, a first capacitor C1, and a second capacitor C2. The first output circuit 4 includes a ninth transistor T9. The second output circuit 17 includes a tenth transistor T10.

A gate of the first transistor T1 is electrically connected to a forward shift control terminal INF. A first terminal of the first transistor T1 is electrically connected to a forward direct current scanning control signal terminal U2D. A second terminal of the first transistor T1 is electrically connected to a third node N3.

A gate of the second transistor T2 is electrically connected to a reverse shift control INB. A first terminal of the second transistor T2 is electrically connected to a reverse direct current scanning control signal terminal D2U. A second terminal of the second transistor T2 is electrically connected to the third node N3.

A gate of the third transistor T3 is electrically connected to a forward direct current scanning control signal terminal U2D. A first terminal of the third transistor T3 is electrically connected to a forward scanning reset control signal terminal RSTF. A second terminal of the third transistor T3 is electrically connected to a gate of the seventh transistor T7.

A gate of the fourth transistor T4 is electrically connected to the reverse direct current scanning control signal terminal D2U. A first terminal of the fourth transistor T4 is electrically connected to a reverse scanning reset control signal terminal RSTB. A second terminal of the fourth transistor T4 is electrically connected to the gate of the seventh transistor T7.

A gate of the fifth transistor T5 is electrically connected to the second node N2. A first terminal of the fifth transistor T5 is electrically connected to a first potential signal line VGL. A second terminal of the fifth transistor T5 is electrically connected to the third node N3.

A gate of the sixth transistor T6 is electrically connected to the third node N3. A first terminal of the sixth transistor T6 is electrically connected to the first potential signal line VGL. A second terminal of the sixth transistor T6 is electrically connected to a second terminal of the seventh transistor T7.

A first terminal of the seventh transistor T7 is electrically connected to a second potential signal line VGH. The second potential signal line VGH is configured to provide an active scanning level.

A gate of the eighth transistor T8 is electrically connected to the second potential signal line VGH. A first terminal of the eighth transistor T8 is electrically connected to the third node N3. A second terminal of the eighth transistor T8 is electrically connected to the first node N1.

A first plate of the first capacitor C1 is electrically connected to the first potential signal line VGL. A second plate of the first capacitor C1 is electrically connected to the second node N2. The first potential signal line VGL is configured to provide an inactive scanning level. When the inactive scanning level is the same as the non-enabling level, the first signal line S described above may be reused as the first potential signal line VGL.

A first plate of the second capacitor C2 is electrically connected to the first node N1. A second plate of the second capacitor C2 is electrically connected to an output signal terminal Gout.

A gate of the ninth transistor T9 is electrically connected to the first node N1. A first terminal of the ninth transistor T9 is electrically connected to a drive signal terminal OUT. A second terminal of the ninth transistor T9 is electrically connected to an output signal terminal Gout.

A gate of the tenth transistor T10 is electrically connected to the second node N2. A first terminal of the tenth transistor T10 is electrically connected to the first potential signal line VGL. A second terminal of the ninth transistor T9 is electrically connected to the output signal terminal Gout.

With reference to FIG. 3, FIG. 16, and FIG. 21, as an example, the shift register circuit 2 performs forward scanning. In the (n+1)$^{th}$ frame F_n+1, after an i$^{th}$ shift unit 3 outputs a high level, the control signal line Greset provides a high level to pull down a potential of the first node N1 in each of the shift units 3. In this case, the first node N1 in the first shift unit 8 turns off the ninth transistor T9. At the same time, the low level of the first node N1 is transmitted to the third node N3 through the eighth transistor T8. The sixth transistor T6 is turned off. The potential of the second node N2 maintains a low level of a previous time period, such that the fifth transistor T5 and the tenth transistor T10 each maintain a turned-off state of the previous time period.

The working principle of a plurality of shift units 3 sequentially outputting the active scanning level is described below:

With reference to FIG. 2, FIG. 3, and FIG. 21, in each of the frames, the forward scanning signal line U2D1 provides a high level to the forward direct current scanning control signal terminal U2D of each of the shift units 3, and the reverse scanning signal line D2U1 provides a low level to the reverse direct current scanning control signal terminal D2U of each of the shift units 3, such that the third transistor T3 of each of the shift units 3 is turned on and the fourth transistor T4 is turned off in the frame.

In a first sub-period t1 within a frame, the forward shift control terminal INF of the first shift unit of the cascaded shift units 3 receives a high level provided by the first frame-start signal line STV1, the reverse scanning reset control signal terminal RSTB of the first shift unit of the cascaded shift units 3 receives a high level provided by the first clock signal line CK1, the drive signal terminal OUT of the first shift unit of the cascaded shift units 3 receives a low level provided by the second clock signal line CK2, and the forward scanning reset control signal terminal RSTF of the first shift unit of the cascaded shift units 3 receives a low level provided by the third clock signal line CK3.

In this sub-period, in the first one the cascaded shift units 3, the first transistor T1 is turned on, and the high level received by the forward direct current scanning control signal terminal U2D is supplied to the third node N3. On the one hand, the high level of the third node N3 is supplied to the first node N1 through the turned-on eighth transistor T8, to turn on the ninth transistor T9. The ninth transistor T9 outputs the low level received by the drive signal terminal OUT to the output signal terminal Gout. On the other hand, the high level of the third node N3 turns on the sixth transistor T6. The sixth transistor T6 supplies, to the second node N2, the low level provided by the first potential signal line VGL. The tenth transistor T10 is turned off. In this sub-period, the output signal terminal Gout of the first shift unit 3 outputs a low level.

In a second sub-period t2 within a frame, the forward shift control terminal INF of the first shift unit of the cascaded shift units 3 receives a low level provided by the first frame-start signal line STV1, the reverse scanning reset control signal terminal RSTB of the first shift unit of the cascaded shift units 3 receives a low level provided by the first clock signal line CK1, the drive signal terminal OUT of the first shift unit of the cascaded shift units 3 receives a high level provided by the second clock signal line CK2, and the forward scanning reset control signal terminal RSTF of the first shift unit of the cascaded shift units 3 receives a low level provided by the third clock signal line CK3.

In this sub-period, in the first shift unit of the cascaded shift units 3, the third node N3 maintains a high level, the ninth transistor T9 remains being tured on, and the high level received by the drive signal terminal OUT is output to the output signal terminal Gout. In this sub-period, the output signal terminal Gout of the first shift unit of the cascaded shift units 3 outputs a high level.

In a third sub-period t3 within a frame, the forward shift control terminal INF of the second shift unit of the cascaded shift units 3 receives a high level output by the output signal terminal Gout of the first shift unit of the cascaded shift units 3, the reverse scanning reset control signal terminal RSTB of the second shift unit of the cascaded shift units 3 receives a low level provided by the second clock signal line CK2, the drive signal terminal OUT of the second shift unit of the cascaded shift units 3 receives a high level provided by the third clock signal line CK3, and the forward scanning reset control signal terminal RSTF of the second shift unit of the cascaded shift units 3 receives a low level provided by the fourth clock signal line CK4. The first shift unit 3 and the second shift unit 4 are the first stage and second stage of the cascaded shift units 3.

In this sub-period, in the second shift unit 3, the first transistor T1 is turned on, and the high level received by the forward direct current scanning control signal terminal U2D is input to the third node N3. On the one hand, the high level of the third node N3 is input to the first node N1 through the turned-on eighth transistor T8, to turn on the ninth transistor T9. The ninth transistor T9 outputs the high level received by the drive signal terminal OUT to the output signal terminal Gout. On the other hand, the high level of the third node N3 turns on the sixth transistor T6. The sixth transistor T6 inputs, to the second node N2, the low level provided by the first potential signal line VGL. The tenth transistor T10 is turned off. In this sub-period, the output signal terminal Gout of the second shift unit 3 outputs a high level.

By analogy, in a fourth sub-period, the forward shift control terminal INF of the third shift unit 3 of the cascaded shift units 3 receives a high level output by the output signal terminal Gout of the second shift unit 3, and the drive signal terminal OUT of the third shift unit 3 receives a high level provided by the fourth clock signal line CK4. The ninth transistor T9 is turned on, and the high level received by the drive signal terminal OUT is output to the output signal terminal Gout. In a fifth sub-period, the forward shift control terminal INF of the fourth shift unit 3 of the cascaded shift units 3 receives a high level output by the output signal terminal Gout of the third shift unit 3, and the drive signal terminal OUT of the fourth shift unit 3 receives a high level provided by the first clock signal line CK1. The ninth transistor T9 is turned on, and the high level received by the drive signal terminal OUT is output to the output signal terminal Gout. In this way, the plurality of shift units sequentially output the high level.

An embodiment of the present disclosure further provides a method for driving a display panel. With reference to FIG. 1 to FIG. 4, the display panel includes a display region DA and a non-display region NA. The display panel further includes pixel circuits 1 and a shift register circuit 2. The pixel circuits 1 are located in the display region DA. The shift register circuit 2 is located in the non-display region NA and includes a plurality of cascaded shift units 3. The shift unit 3 includes a first output circuit 4, a control circuit 5, and a first node N1. The first output circuit 4 is configured to output an active scanning level or an inactive scanning level in response to an enabling level of the first node N1. The control circuit 5 is configured to provide a non-enabling level to the first node N1.

The display panel has a first mode FM. In the first mode FM, the display region DA includes a first sub-region DA1 and a second sub-region DA2 that are adjacent in a first direction x. The pixel circuits 1 include pixel circuits 1 in the first sub-region DA1 and pixel circuits 1 in the second sub-region DA2. Data refreshing is performed at a first frequency data in the first sub-region DA1. Data refreshing is performed at a second frequency data in the second sub-region DA2. The first frequency is greater than the second frequency. The shift register circuit 2 includes a first unit group 6 and a second unit group 7. The first unit group 6 is electrically connected to the pixel circuits 1 in the first sub-region DA1. The second unit group 7 is electrically connected to the pixel circuits 1 in the second sub-region DA2. The shift unit 3 adjacent to the first unit group 6 in the second unit group 7 is a first shift unit 8. For example, the shift unit 3 in the second unit group 7 that is cascaded subsequent to the last shift unit in the first unit group 6 is the first shift unit 8.

The driving method includes: in the first mode FM, in some frames, the first unit group 6 and the second unit group 7 sequentially output the active scanning level, and in some frames, the control circuit 5 in the first shift unit 8 supplies the non-enabling level to the first node N1 at least after the first unit group 6 outputs the active scanning level. Duration of one frame is t, $$t = \frac{1}{f},$$

and f is a reference frequency. The reference frequency is greater than or equal to the first frequency, and the reference frequency is an integer multiple of each of the first frequency and the second frequency.

With reference to the foregoing analysis, in this embodiment of the present disclosure, through the control circuits 5 in the shift units 3, in some frames in the first mode FM, the control circuit 5 in the first shift unit 8 cut off a shift path from the first unit group 6 to the second unit group 7, such that the second unit group 7 does not output the active scanning level in these frames. Therefore, data cannot be refreshed in the second sub-region DA2 in these frames, thereby reducing the refresh rate of the second sub-region DA2. In this way, when different contents are displayed in different sub-regions, data refresh rates of the different sub-regions can be adjusted according to contents to be displayed therein, thereby avoiding a waste of power consumption resulting from high-frequency driving of the entire screen.

In some embodiments, with reference to FIG. 4 and FIG. 5, the first mode FM includes at least one first sub-mode FM1. In the first sub-mode FM1, f1=x1×f2, f1 is the first frequency, f2 is the second frequency, x1 is an integer and x1≥2, and the reference frequency is equal to the first frequency.

The process of: in the first mode FM, in some frames, controlling the first unit group 6 and the second unit group 7 to sequentially output the active scanning level, and in some frames, controlling the control circuit 5 in the first shift unit 8 to supply the non-enabling level to the first node N1 at least after the first unit group 6 outputs the active scanning level, includes: in the first sub-mode FM1, a scanning direction of the display region DA is from the first sub-region DA1 to the second sub-region DA2, for every x1 adjacent frames, in one of the x1 frames, the first unit group 6 and the second unit group 7 sequentially output the active scanning level, and in the remaining x1-1 frames, the control circuit 5 in the first shift unit 8 supplies the non-enabling level to the first node N1 at least after the first unit group 6 outputs the active scanning level.

For the specific analysis of the first sub-mode FM1, refer to the foregoing embodiment. Details are not described herein again.

In the first sub-mode FM1, when the first frequency and the second frequency are in an integer-multiple relationship, compared with setting the reference frequency to twice, three times, or the like of the first frequency, directly setting the reference frequency to be the same as the first frequency can prevent the reference frequency from being too high, thereby avoiding a high requirement on the design of the frequency of the display panel.

In some embodiments, with reference to FIG. 6 and FIG. 7, the at least one first sub-mode FM1 includes a first-type first sub-mode FM1-1. In the first-type first sub-mode FM1-1, the display region DA further includes a third sub-region DA3 that is adjacent to the second sub-region DA2 in the first direction x. The scanning direction of the display region DA is from the first sub-region DA1 to the third sub-region DA3. Data refreshing is performed at a third frequency in the third sub-region DA3. f1=k1×x1×f3, f3 is the third frequency, and k1 is an integer and k1≥2. The shift register circuit 2 further includes a third unit group 9. The third unit group 9 is electrically connected to the pixel circuits 1 in the third sub-region DA3. The shift unit 3 adjacent to the second unit group 7 in the third unit group 9 is a second shift unit 10. For example, the shift unit 3 in the third unit group 9 that is cascaded subsequent to the last shift unit in the second unit group 7 is the second shift unit 10.

In the first-type first sub-mode FM1-1, the driving method further includes: in the first sub-mode FM1, for every k1×x1 adjacent frames, in one of the k1×x1 frames, after the second unit group 7 outputs the active scanning level, controlling the shift units 3 in the third unit group 9 to sequentially output the active scanning level. In k1-1 frames of the k1×x1 frames, the control circuit 5 in the second shift unit 10 supplies the non-enabling level to the first node N1 at least after the second unit group 7 outputs the active scanning level.

For the specific analysis of the first-type first sub-mode FM1-1, refer to the foregoing embodiment. Details are not described herein again.

The foregoing arrangement can enable the display panel to perform display in at least three sub-regions at different frequencies in the first-type first sub-mode FM1-1. In this mode, the frequencies of the three sub-regions are gradually reduced sub-region by sub-region. Compared with the display in two sub-regions at different frequencies, this partition display manner is more flexible, suitable for more application scenarios. For example, a video screen may be displayed at a high frequency in one sub-region, a comment screen may be displayed at a low frequency in another sub-region, and a static screen such as a black border may be displayed at an ultra-low frequency in another sub-region. In addition, this display mode allows more precise control of frequencies at different positions of the display region DA to reduce power consumption to a greater extent.

In some embodiments, with reference to FIG. 8 and FIG. 9, the at least one first sub-mode FM1 includes a second-type first sub-mode FM1-2. In the second-type first sub-mode FM1-2, the display region DA further includes a fourth sub-region DA4 that is adjacent to the first sub-region DA1 in the first direction x. The fourth sub-region DA4 and the second sub-region DA2 are located at two opposite sides of the first sub-region DA1. The scanning direction of the display region DA is from the fourth sub-region DA4 to the second sub-region DA2. Data refreshing is performed at a fourth frequency in the fourth sub-region DA4. $f1=k2 \times x1 \times f4$, f4 is the fourth frequency, and k2 is an integer and $k2 \geq 2$. The shift register circuit 2 further includes a fourth unit group 11. The shift units 3 in the fourth unit group 11 are electrically connected to the pixel circuits 1 in the fourth sub-region DA4.

In the second-type first sub-mode FM1-2, the driving method further includes: for every $k2 \times x1$ adjacent frames, in each of the $k2 \times x1$ frames, controlling the fourth unit group 11 and the first unit group 6 to sequentially output the active scanning level, in x1 frames of the $k2 \times x1$ frames, after the first unit group 6 outputs the active scanning level, controlling the shift units in the second unit group 7 to sequentially output the active scanning level, in the remaining $(k2-1) \times x1$ frames, controlling the control circuit 5 in the first shift unit 8 to supply the non-enabling level to the first node N1 at least after the first unit group 6 outputs the active scanning level, and for every $k2 \times x1$ adjacent frames, in one of the $k2 \times x1$ frames, writing data voltages to the pixel circuits in the fourth sub-region, and in the remaining $k2 \times x1-1$ frames, not writing data voltages to the pixel circuits in the fourth sub-region.

For the specific analysis of the second-type first sub-mode FM1-2, refer to the foregoing embodiment. Details are not described herein again.

The foregoing arrangement can enable the display panel to perform display in three sub-regions at different frequencies in the second-type first sub-mode FM1-2, for example perform display with a high frequency in the middle sub-region and low frequencies in the upper and lower sub-regions. Compared with the display in two sub-regions at different frequencies, this partition display manner is more flexible, suitable for more application scenarios. For example, a video screen may be displayed at a high frequency in the middle sub-region, a static screen such as a black border may be displayed at an ultra-low frequency in the upper sub-region, and a comment screen may be displayed at a low frequency in the lower sub-region. In addition, this display mode allows more precise control of frequencies at different positions of the display region DA to reduce power consumption to a greater extent.

In some embodiments, with reference to FIG. 10 and FIG. 11, the at least one first sub-mode FM1 includes a third-type first sub-mode FM1-3. In the third-type first sub-mode FM1-3, the display region DA further includes a fifth sub-region DA5 that is adjacent to the first sub-region DA1 in the first direction x. The fifth sub-region DA5 and the second sub-region DA2 are located at two opposite sides of the first sub-region DA1. The scanning direction of the display region DA is from the fifth sub-region DA5 to the second sub-region DA2. Data refreshing is performed at a fifth frequency in the fifth sub-region DA5. $f5=k3 \times f2$, f5 is the fifth frequency, and k3 is an integer and $k3 \geq 2$. The shift register circuit 2 further includes a fifth unit group 12. The shift units 3 in the fifth unit group 12 are electrically connected to the pixel circuits 1 in the fifth sub-region DA5.

In the third-type first sub-mode FM1-3, the driving method further includes: for every x1 adjacent frames, in each of the x1 frames, controlling the fifth unit group 12 and the first unit group 6 to sequentially output the active scanning level, in one of the x1 frames, after the first unit group 6 outputs the active scanning level, controlling the shift units 3 in the second unit group 7 to sequentially output the active scanning level, in the remaining x1-1 frames, controlling the control circuit 5 in the first shift unit 8 to supply the non-enabling level to the first node N1 at least after the first unit group 6 outputs the active scanning level, and for every x1 adjacent frames, in one frame of any k3 adjacent frames of the x1 frames, writing data voltages to the pixel circuits in the fifth sub-region DA5, and not writing data voltages to the pixel circuits in the fifth sub-region DA5 in the remaining k3-1 frames of any k3 adjacent frames of the x1 frames.

For the specific analysis of the third-type first sub-mode FM1-3, refer to the foregoing embodiment. Details are not described herein again.

The foregoing arrangement can enable the display panel to perform display in three sub-regions at different frequencies in the third-type first sub-mode FM1-3, for example perform display with a high frequency in the middle sub-region and low frequencies in the upper and lower sub-regions. Compared with the display in two sub-regions at different frequencies, this partition display manner is more flexible, suitable for more application scenarios. For example, a video screen may be displayed at a high frequency in the middle sub-region, a comment screen may be displayed at a low frequency in the upper sub-region, and a static screen such as a black border may be displayed at an ultra-low frequency in the lower sub-region. In addition, this display mode allows more precise control of frequencies at different positions of the display region DA to reduce power consumption to a greater extent.

In some embodiments, with reference to FIG. 12 and FIG. 13, the at least one first sub-mode FM1 includes a fourth-type first sub-mode FM1-4. In the fourth-type first sub-mode FM1-4, the display region DA further includes a sixth sub-region DA6 that is adjacent to the first sub-region DA1 in the first direction x. The sixth sub-region DA6 and the second sub-region DA2 are located at two opposite sides of the first sub-region DA1. The scanning direction of the display region DA is from the sixth sub-region DA6 to the second sub-region DA2. Data refreshing is performed at a second frequency in the sixth sub-region DA6. The shift register circuit 2 further includes a sixth unit group 13. The shift units 3 in the sixth unit group 13 are electrically connected to the pixel circuits 1 in the sixth sub-region DA6.

In the fourth-type first sub-mode FM1-4, the driving method further includes: for every x1 adjacent frames, in each of the x1 frames, controlling the sixth unit group 13 and the first unit group 6 to sequentially output the active scanning level, in one frame of the x1 frames, after the first unit group 6 outputs the active scanning level, controlling the shift units of the second unit group 7 to sequentially output the active scanning level, in the remaining x1-1 frames, controlling the control circuit 5 in the first shift unit 8 to supply the non-enabling level to the first node N1 at least after the first unit group 6 outputs the active scanning level, and for every x1 adjacent frames, writing data voltages to the sixth sub-region DA6 in one of the x1 frames, and not writing the data voltages to the sixth sub-region DA6 in the remaining x1-1 frames.

For the specific analysis of the fourth-type first sub-mode FM1-4, refer to the foregoing embodiment. Details are not described herein again.

The foregoing arrangement can enable the display panel to perform display in three sub-regions at different frequencies in the fourth-type first sub-mode FM1-4, for example perform display with a high frequency in the middle sub-region and low frequencies in the upper and lower sub-regions. Compared with the display in two sub-regions at different frequencies, this partition display manner is more flexible, suitable for more application scenarios. For example, a video screen may be displayed at a high frequency in the middle sub-region, and a comment screen and a static screen such as a black border may be displayed at a same low frequency in the upper and lower sub-regions, respectively. In addition, this display mode allows more precise control of frequencies at different positions of the display region DA to reduce power consumption to a greater extent.

In some embodiments, with reference to FIG. 14 and FIG. 15, the first mode FM includes a second sub-mode FM2. In the second sub-mode FM2, the first frequency is a non-integer multiple of the second frequency, the reference frequency is m1 times of the first frequency, and the reference frequency is m2 times of the second frequency.

The process of: in the first mode FM, in some frames, controlling the first unit group 6 and the second unit group 7 to sequentially output the active scanning level, and in some frames, controlling the control circuit 5 in the first shift unit 8 to supply the non-enabling level to the first node N1 at least after the first unit group 6 outputs the active scanning level, includes: in the second sub-mode FM2, every m1×m2 adjacent frames include m1 first frames F1, m2-1 second frames F2, and m1×m2−m1−(m2−1) third frames F3. In the first frame F1, the first unit group 6 and the second unit group 7 sequentially output the active scanning level, and in m1-1 first frames F1 of the m1 first frames F1, data voltages are not written to the first sub-region DA1. In the second frame F2, the first unit group 6 outputs the active scanning level, and the control circuit 5 in the first shift unit 8 supplies the non-enabling level to the first node N1 at least after the first unit group 6 outputs the active scanning level. In the third frame F3, the control circuit 5 in a third shift unit 14 supplies the non-enabling level to the first node N1. The third shift unit 14 is a shift unit 3 farthest away from the second unit group 7 in the first unit group 6.

For the specific analysis of the second sub-mode FM2, refer to the foregoing embodiment. Details are not described herein again.

In the foregoing arrangement, the frequencies of the first sub-region DA1 and the second sub-region DA2 are not in an integer-multiple relationship, such that limitations on the frequency design of the two sub-regions can be reduced, thereby making the frequency design of the two sub-regions more flexible.

In some embodiments, referring to FIG. 2 again, the shift units 3 are electrically connected to clock signal lines. The clock signal lines may include the first clock signal line CK1, the second clock signal line CK2, the third clock signal line CK3, and the fourth clock signal line CK4 described above.

In the first mode FM, in some frames, after the first unit group 6 outputs the active scanning level, the control circuit 5 in the first shift unit 8 supplies the non-enabling level to the first node N1, and the clock signal line stops providing any signal, to further reduce power consumption.

Figure 23:
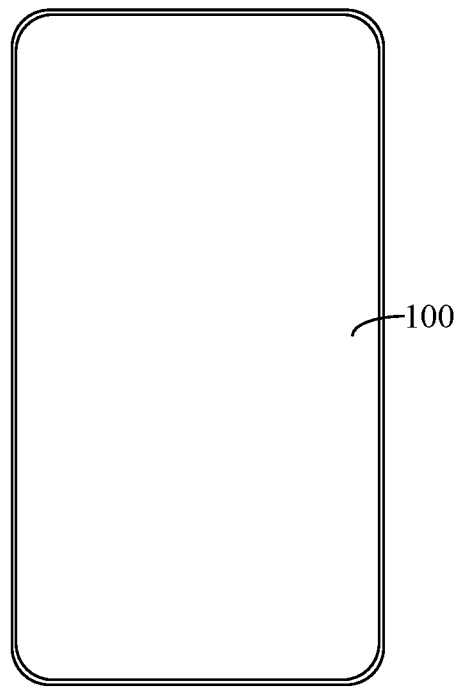
FIG. 23 is a schematic structural diagram of a display apparatus according to an embodiment of the present disclosure.

Embodiments of the present disclosure further provide a display apparatus. FIG. 23 is a schematic structural diagram of a display apparatus according to an embodiment of the present disclosure. As shown in FIG. 23, the display apparatus includes the foregoing display panel 100. A specific structure of the display panel 100 has been described in detail in the foregoing embodiments. Details are not described herein again. Certainly, the display apparatus shown in FIG. 23 is for schematic description only. The display apparatus may be any electronic device with a display function, such as a mobile phone, a tablet computer, a notebook computer, an ebook, or a television.

The above descriptions are merely exemplary embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the above embodiments are merely intended to describe the technical solutions of the present disclosure, rather than to limit the present disclosure. Although the present disclosure is described in detail with reference to the above embodiments, persons of ordinary skill in the art should understand that they may still make modifications to the technical solutions described in the above embodiments or make equivalent replacements to some or all technical features thereof, without departing from the essence of the technical solutions in the embodiments of the present disclosure.

What is claimed is:

1. A display panel, comprising:
   a display region and a non-display region;
   pixel circuits located in the display region; and
   a shift register circuit located in the non-display region and comprising a plurality of cascaded shift units, wherein each shift unit comprises a first output circuit, a control circuit and a first node, the first output circuit is configured to output an active scanning level or an inactive scanning level in response to an enabling level at the first node, and the control circuit is configured to output a non-enabling level to the first node,
   wherein the display panel has a first mode,
   in the first mode, the display region comprises a first sub-region and a second sub-region that are adjacent in a first direction, data refreshing of the first sub-region is performed at a first frequency, data refreshing of the second sub-region is performed at a second frequency, the first frequency is greater than the second frequency, the shift register circuit comprises a first unit group and a second unit group, the first unit group is electrically connected to the pixel circuits in the first sub-region, the second unit group is electrically connected to the pixel circuits in the second sub-region, and the shift unit in the second unit group that is cascaded subsequent to a last shift unit in the first unit group is a first shift unit,
   in the first mode, in some frames, the first unit group and the second unit group sequentially output the active scanning level, and in some frames, the control circuit in the first shift unit supplies the non-enabling level to the first node at least after the first unit group outputs the active scanning level, and wherein a duration of one frame is t, $$t = \frac{1}{f},$$

where f is a reference frequency greater than or equal to the first frequency, and the reference frequency is an integer-multiple of each of the first frequency and the second frequency.

2. The display panel according to claim 1, wherein the first mode comprises at least one first sub-mode,
in the first sub-mode, f1=x1×f2, where f1 is the first frequency, f2 is the second frequency, x1 is an integer and x1≥2, and the reference frequency is equal to the first frequency, and
in the first sub-mode, a scanning direction of the display region is from the first sub-region to the second sub-region, for every x1 adjacent frames, in one frame of the x1 frames, the first unit group and the second unit group sequentially output the active scanning level, and in remaining x1-1 frames, the control circuit in the first shift unit supplies the non-enabling level to the first node at least after the first unit group outputs the active scanning level.

3. The display panel according to claim 2, wherein the at least one first sub-mode comprises a first-type first sub-mode, and in the first-type first sub-mode, the display region further comprises a third sub-region that is adjacent to the second sub-region in the first direction, the scanning direction of the display region is from the first sub-region to the third sub-region, data refreshing of the third sub-region is performed at a third frequency, f1=k1×x1×f3, where f3 is the third frequency, k1 is an integer and k1≥2, the shift register circuit further comprises a third unit group, the third unit group is electrically connected to the pixel circuits in the third sub-region, and the shift unit in the third unit group that is cascaded subsequent to a last shift unit in the second unit group is a second shift unit, and
in the first-type first sub-mode, for every k1×x1 adjacent frames, in one of the k1×x1 frames, after the second unit group outputs the active scanning level, the shift units in the third unit group sequentially output the active scanning level, and in k1-1 frames of the k1×x1 frames, the control circuit in the second shift unit supplies the non-enabling level to the first node at least after the second unit group outputs the active scanning level.

4. The display panel according to claim 2, wherein the at least one first sub-mode comprises a second-type first sub-mode, and in the second-type first sub-mode, the display region further comprises a fourth sub-region that is adjacent to the first sub-region in the first direction, the fourth sub-region and the second sub-region are located at two opposite sides of the first sub-region respectively, the scanning direction of the display region is from the fourth sub-region to the second sub-region, data refreshing of the fourth sub-region is performed at a fourth frequency, f1=k2×x1×f4, where f4 is the fourth frequency, k2 is an integer and k2≥2, the shift register circuit further comprises a fourth unit group, and the shift unit in the fourth unit group is electrically connected to the pixel circuits in the fourth sub-region,
in the second-type first sub-mode, for every k2×x1 adjacent frames, in each of the k2×x1 frames, the fourth unit group and the first unit group sequentially output the active scanning level, in x1 frames of the k2×x1 frames, after the first unit group outputs the active scanning level, the shift units in the second unit group sequentially output the active scanning level, and in remaining (k2−1)×x1 frames, the control circuit in the first shift unit supplies the non-enabling level to the first node at least after the first unit group outputs the active scanning level, and
for every k2×x1 adjacent frames, in one of the k2×x1 frames, data voltages are written into the pixel circuits in the fourth sub-region, and in remaining (k2×x1−1) frames, no data voltage is written into the pixel circuits in the fourth sub-region.

5. The display panel according to claim 2, wherein the at least one first sub-mode comprises a third-type first sub-mode, and in the third-type first sub-mode, the display region further comprises a fifth sub-region that is adjacent to the first sub-region in the first direction, the fifth sub-region and the second sub-region are located at two opposite sides of the first sub-region, the scanning direction of the display region is from the fifth sub-region to the second sub-region, data refreshing of the fifth sub-region is performed at a fifth frequency, f5=k3×f2, where f5 is the fifth frequency, k3 is an integer and k3≥2, the shift register circuit further comprises a fifth unit group, and the shift unit in the fifth unit group is electrically connected to the pixel circuit in the fifth sub-region,
in the third-type first sub-mode, for every x1 adjacent frames, in each of the x1 frames, the fifth unit group and the first unit group sequentially output the active scanning level, in one of the x1 frames, after the first unit group outputs the active scanning level, the pixel circuits in the second unit group sequentially output the active scanning level, and in remaining x1-1 frames, the control circuit in the first shift unit supplies the non-enabling level to the first node at least after the first unit group outputs the active scanning level, and
for every x1 adjacent frames, in any k3 adjacent ones of the x1 frames, in one of the k3 frames, data voltages are written into the pixel circuits in the fifth sub-region, and in remaining k3-1 frames, no data voltage is written into the pixel circuits in the fifth sub-region.

6. The display panel according to claim 2, wherein the at least one first sub-mode comprises a fourth-type first sub-mode, and in the fourth-type first sub-mode, the display region further comprises a sixth sub-region that is adjacent to the first sub-region in the first direction, the sixth sub-region and the second sub-region are located at two opposite sides of the first sub-region respectively, the scanning direction of the display region is from the sixth sub-region to the second sub-region, data refreshing of the sixth sub-region is performed at the second frequency, the shift register circuit further comprises a sixth unit group, and the shift units in the sixth unit group are electrically connected to the pixel circuits in the sixth sub-region,
in the fourth-type first sub-mode, for every x1 adjacent frames, in each of the x1 frames, the sixth unit group and the first unit group sequentially output the active scanning level, in one of the x1 frames, after the first unit group outputs the active scanning level, the pixel circuits in the second unit group sequentially output the active scanning level, and in remaining x1-1 frames, the control circuit in the first shift unit supplies the non-enabling level to the first node at least after the first unit group outputs the active scanning level, and
for every x1 adjacent frames, in one of the x1 frames, data voltages are written into the pixel circuits in the sixth sub-region, and in remaining x1-1 frames, no data voltage is written into the pixel circuits in the sixth sub-region.

7. The display panel according to claim 1, wherein the first mode comprises a second sub-mode,
in the second sub-mode, the first frequency is a non-integer multiple of the second frequency, the reference frequency is m1 times the first frequency, and the reference frequency is m2 times the second frequency, and
in the second sub-mode, every m1×m2 adjacent frames comprise m1 first frames, m2-1 second frames, and m1×m2−m1−(m2−1) third frames, wherein in each first frame, the first unit group and the second unit group sequentially output the active scanning level, and in m1-1 frames of the m1 first frames, no data voltage is written into the pixel circuits in the first sub-region, in each second frame, the first unit group outputs the active scanning level, and the control circuit in the first shift unit supplies the non-enabling level to the first node at least after the first unit group outputs the active scanning level, and in each third frame, the control circuit in a third shift unit supplies the non-enabling level to the first node, and the third shift unit is a shift unit farthest away from the second unit group in the first unit group.

8. The display panel according to claim 1, wherein the control circuits in the plurality of shift units are electrically connected to a control signal line, and the control circuit is configured to supply the non-enabling level to the first node in response to a conduction level provided by the control signal line, and
in the first mode, in one or more frames, the control signal line provides a non-conduction level, and in one or more frames, the control signal line provides the conduction level after the first unit group outputs the active scanning level.

9. The display panel according to claim 1, wherein the control circuit in the shift unit in the first unit group is electrically connected to a first control signal line, the control circuit in the shift unit in the second unit group is electrically connected to a second control signal line, and the control circuit is configured to provide the non-enabling level to the first node in response to a conduction level provided by the first control signal line or the second control signal line, and
in the first mode, the first control signal line provides a non-conduction level, in one or more frames, the second control signal line provides the non-conduction level, and in another one or more frames, the second control signal line provides the conduction level at least after the first unit group outputs the active scanning level.

10. The display panel according to claim 1, wherein the control circuit comprises a control transistor, the control transistor is electrically connected between a first signal line and the first node, and the first signal line is configured to provide the non-enabling level.

11. The display panel according to claim 1, wherein the shift unit is electrically connected to a clock signal line, and
in the first mode, in one or more frames, after the first unit group outputs the active scanning level, the control circuit in the first shift unit provides the non-enabling level to the first node, and the clock signal line stops providing any signal.

12. The display panel according to claim 1, wherein the shift unit further comprises:

a driver circuit configured to provide the enabling level or the non-enabling level to the first node, and provide the enabling level or the non-enabling level to a second node, and
a second output circuit configured to output the inactive scanning level in response to the enabling level of the second node.

13. A method for driving a display panel, wherein the display panel comprises:
a display region and a non-display region;
pixel circuits located in the display region; and
a shift register circuit located in the non-display region and comprising a plurality of cascaded shift units, wherein each shift unit comprises a first output circuit, a control circuit and a first node, the first output circuit is configured to output an active scanning level or an inactive scanning level in response to an enabling level at the first node, and the control circuit is configured to provide a non-enabling level to the first node,
wherein the display panel has a first mode, and in the first mode, the display region comprises a first sub-region and a second sub-region that are adjacent in a first direction, data refreshing of the first sub-region is performed at a first frequency, data refreshing of the second sub-region is performed at a second frequency, the first frequency is greater than the second frequency, the shift register circuit comprises a first unit group and a second unit group, the first unit group is electrically connected to the pixel circuits in the first sub-region, the second unit group is electrically connected to the pixel circuits in the second sub-region, and the shift unit in the second unit group that is cascaded subsequent to a last shift unit in the first unit group is a first shift unit,
the method comprising:
in the first mode, in some frames, controlling the first unit group and the second unit group to sequentially output the active scanning level, and in some frames, controlling the control circuit in the first shift unit to supply the non-enabling level to the first node at least after the first unit group outputs the active scanning level,
wherein a duration of one frame is t, $$t = \frac{1}{f},$$

where f is a reference frequency greater than or equal to the first frequency, and the reference frequency is an integer multiple of each of the first frequency and the second frequency.

14. The method according to claim 13, wherein the first mode comprises at least one first sub-mode, and in the first sub-mode, f1=x1×f2, f1 is the first frequency, f2 is the second frequency, x1 is an integer and x1≥2, and the reference frequency is equal to the first frequency,
a process of: in the first mode, in some frames, controlling the first unit group and the second unit group to sequentially output the active scanning level, and in some frames, controlling the control circuit in the first shift unit to supply the non-enabling level to the first node at least after the first unit group outputs the active scanning level, comprises:
in the first sub-mode, a scanning direction of the display region is from the first sub-region to the second sub-region, for every x1 adjacent frames, in one of the x1 frames, the first unit group and the second unit group sequentially output the active scanning level, and in remaining x1-1 frames, the control circuit in the first shift unit supplies the non-enabling level to the first node at least after the first unit group outputs the active scanning level.

15. The method according to claim 14, wherein the at least one first sub-mode comprises a first-type first sub-mode, and in the first-type first sub-mode, the display region further comprises a third sub-region that is adjacent to the second sub-region in the first direction, the scanning direction of the display region is from the first sub-region to the third sub-region, data refreshing is performed at a third frequency in the third sub-region, f1=k1×x1×f3, f3 is the third frequency, k1 is an integer and k1≥2, the shift register circuit further comprises a third unit group, the third unit group is electrically connected to the pixel circuits in the third sub-region, and the shift unit in the third unit group that is cascaded subsequent to a last shift unit in the second unit group is a second shift unit, and in the first-type first sub-mode, the method further comprises: in the first-type first sub-mode, for every k1×x1 adjacent frames, in one of the k1×x1 frames, after the second unit group outputs the active scanning level, controlling the pixel circuits in the third unit group to sequentially output the active scanning level, and in k1-1 frames of the k1×x1 frames, controlling the control circuit in the second shift unit to supply the non-enabling level to the first node at least after the second unit group outputs the active scanning level.

16. The method according to claim 14, wherein the at least one first sub-mode comprises a second-type first sub-mode, and in the second-type first sub-mode, the display region further comprises a fourth sub-region that is adjacent to the first sub-region in the first direction, the fourth sub-region and the second sub-region are located at two opposite sides of the first sub-region, the scanning direction of the display region is from the fourth sub-region to the second sub-region, data refreshing is performed at a fourth frequency in the fourth sub-region, f1=k2×x1×f4, f4 is the fourth frequency, k2 is an integer and k2≥2, the shift register circuit further comprises a fourth unit group, and the shift units in the fourth unit group are electrically connected to the pixel circuits in the fourth sub-region, and in the second-type first sub-mode, the method further comprises: for every k2×x1 adjacent frames, in each of the k2×x1 frames, controlling the fourth unit group and the first unit group to sequentially output the active scanning level, in x1 frames of the k2×x1 frames, after the first unit group outputs the active scanning level, controlling the shift units in the second unit group to sequentially output the active scanning level, and in remaining (k2−1)×x1 frames, controlling the control circuit in the first shift unit to provide the non-enabling level to the first node at least after the first unit group outputs the active scanning level, and for every k2×x1 adjacent frames, in one of the k2×x1 frames, writing data voltages to the pixel circuits in the fourth sub-region, and in remaining k2×x1−1 frames, not writing any data voltage to the pixel circuits in the fourth sub-region.

17. The method according to claim 14, wherein the at least one first sub-mode comprises a third-type first sub-mode, and in the third-type first sub-mode, the display region further comprises a fifth sub-region that is adjacent to the first sub-region in the first direction, the fifth sub-region and the second sub-region are located at two opposite sides of the first sub-region, the scanning direction of the display region is from the fifth sub-region to the second sub-region, data refreshing is performed at a fifth frequency in the fifth sub-region, f5=k3×f2, f5 is the fifth frequency, k3 is an integer and k3≥2, the shift register circuit further comprises a fifth unit group, and the shift units in the fifth unit group are electrically connected to the pixel circuits in the fifth sub-region, and in the third-type first sub-mode, the method further comprises: for every x1 adjacent frames, in each of the x1 frames, controlling the fifth unit group and the first unit group to sequentially output the active scanning level, in one of the x1 frames, after the first unit group outputs the active scanning level, controlling the shift units in the second unit group to sequentially output the active scanning level, and in remaining x1-1 frames, controlling the control circuit in the first shift unit to supply the non-enabling level to the first node at least after the first unit group outputs the active scanning level, and for every x1 adjacent frames, in one frame of any k3 adjacent frames of the x1 frames, writing data voltages to the pixel circuits in the fifth sub-region, and not writing any data voltage to the pixel circuits in the fifth sub-region in remaining k3-1 frames.

18. The method according to claim 14, wherein the at least one first sub-mode comprises a fourth-type first sub-mode, and in the fourth-type first sub-mode, the display region further comprises a sixth sub-region that is adjacent to the first sub-region in the first direction, the sixth sub-region and the second sub-region are located at two opposite sides of the first sub-region, the scanning direction of the display region is from the sixth sub-region to the second sub-region, data refreshing is performed at the second frequency in the sixth sub-region, the shift register circuit further comprises a sixth unit group, and the shift units in the sixth unit group are electrically connected to the pixel circuits in the sixth sub-region, and in the fourth-type first sub-mode, the method further comprises: for every x1 adjacent frames, in each of the x1 frames, controlling the sixth unit group and the first unit group to sequentially output the active scanning level, in one of the x1 frames, after the first unit group outputs the active scanning level, controlling the shift units in the second unit group to sequentially output the active scanning level, and in remaining x1-1 frames, controlling the control circuit in the first shift unit to supply the non-enabling level to the first node at least after the first unit group outputs the active scanning level, and for every x1 adjacent frames, writing data voltages to the pixel circuits in the sixth sub-region in one of the x1 frames, and not writing any data voltage to the pixel circuits in the sixth sub-region in remaining x1-1 frames.

19. The method according to claim 13, wherein the first mode comprises a second sub-mode, and in the second sub-mode, the first frequency is a non-integer multiple of the second frequency, the reference frequency is m1 times the first frequency and is m2 times the second frequency, and a process of: in the first mode, in some frames, controlling the first unit group and the second unit group to sequentially output the active scanning level, and in some frames, controlling the control circuit in the first shift unit to supply the non-enabling level to the first node at least after the first unit group outputs the active scanning level, comprises:

in the second sub-mode, every m1×m2 adjacent frames comprise m1 first frames, m2-1 second frames, and m1×m2−m1−(m2−1) third frames, in each first frame, the first unit group and the second unit group sequentially output the active scanning level, and in m1-1 first frames of the m1 first frames, no data voltage is not written to the pixel circuits in the first sub-region, in each second frame, the first unit group outputs the active scanning level, and the control circuit in the first shift unit supplies the non-enabling level to the first node at least after the first unit group outputs the active scanning level, and in each third frame, the control circuit in a third shift unit supplies the non-enabling level to the first node, wherein the third shift unit is a shift unit farthest away from the second unit group in the first unit group.

20. The method according to claim 13, wherein the shift unit is electrically connected to a clock signal line, and in the first mode, in some frames, after the first unit group outputs the active scanning level, the control circuit in the first shift unit supplies the non-enabling level to the first node, and the clock signal line stops providing any signal.

* * * * *